US011910597B2

(12) United States Patent
Karda et al.

(10) Patent No.: US 11,910,597 B2
(45) Date of Patent: Feb. 20, 2024

(54) INTEGRATED ASSEMBLIES HAVING TRANSISTOR BODY REGIONS COUPLED TO CARRIER-SINK-STRUCTURES; AND METHODS OF FORMING INTEGRATED ASSEMBLIES

(71) Applicant: Micron Technology, Inc., Boise, ID (US)

(72) Inventors: Kamal M. Karda, Boise, ID (US); Haitao Liu, Boise, ID (US); Durai Vishak Nirmal Ramaswamy, Boise, ID (US); Yunfei Gao, Boise, ID (US); Sanh D. Tang, Meridian, ID (US); Deepak Chandra Pandey, Uttarakhand (IN)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 17/734,410

(22) Filed: May 2, 2022

(65) Prior Publication Data
US 2022/0262813 A1    Aug. 18, 2022

Related U.S. Application Data

(62) Division of application No. 16/810,009, filed on Mar. 5, 2020, now Pat. No. 11,348,932.
(Continued)

(51) Int. Cl.
*H10B 41/27* (2023.01)
*G11C 5/06* (2006.01)
(Continued)

(52) U.S. Cl.
CPC ............. *H10B 41/27* (2023.02); *G11C 5/025* (2013.01); *G11C 5/06* (2013.01); *H10B 43/27* (2023.02)

(58) Field of Classification Search
None
See application file for complete search history.

(56) References Cited

U.S. PATENT DOCUMENTS 5,299,155 A    3/1994    Yanagi
5,357,460 A    10/1994   Yusuki et al.
(Continued)

FOREIGN PATENT DOCUMENTS

JP    05-041502    2/1993
WO    WO    11/2018
PCT/US2018/043313
(Continued)

OTHER PUBLICATIONS

Mulaosmanovic et al., "Switching Kinetics in Nanoscale Hafnium Oxide Based Ferroelectric Field-Effect Transistors", ACS Applied Materials & Interfaces, vol. 9, 2017, United States, pp. 3792-3798.
(Continued)

*Primary Examiner* — Hsien Ming Lee
(74) *Attorney, Agent, or Firm* — Wells St. John P.S.

(57) ABSTRACT

Some embodiments include an integrated assembly having a carrier-sink-structure, and having digit lines over the carrier-sink-structure. Transistor body regions are over the digit lines. Extensions extend from the carrier-sink-structure to the transistor body regions. The extensions are configured to drain excess carriers from the transistor body regions. Lower source/drain regions are between the transistor body regions and the digit lines, and are coupled with the digit lines. Upper source/drain regions are over the transistor body regions, and are coupled with storage elements. Gates are adjacent the transistor body regions. The transistor body regions, lower source/drain regions and upper source/drain regions are together comprised a plurality of transistors. The transistors and the storage elements are together comprised
(Continued)

by a plurality of memory cells of a memory array. Some embodiments include methods of forming integrated assemblies.

8 Claims, 45 Drawing Sheets

Related U.S. Application Data

(60) Provisional application No. 62/814,689, filed on Mar. 6, 2019.

(51) Int. Cl.
*G11C 5/02* (2006.01)
*H10B 43/27* (2023.01)

(56) References Cited

U.S. PATENT DOCUMENTS

| | | | |
|---|---|---|---|
| 7,378,702 | B2 | 5/2008 | Lee |
| 8,796,751 | B2 | 8/2014 | Ramaswamy et al. |
| 8,878,271 | B2 | 11/2014 | Karda et al. |
| 8,916,478 | B2 | 12/2014 | Masuoka et al. |
| 9,030,881 | B2 | 5/2015 | Tokuhira et al. |
| 9,293,556 | B2 | 3/2016 | van Bentum et al. |
| 9,324,406 | B2 | 4/2016 | Shuto et al. |
| 9,559,118 | B2 | 1/2017 | Karda et al. |
| 9,590,066 | B2 | 3/2017 | Ramaswamy et al. |
| 9,761,715 | B2 | 9/2017 | Ramaswamy et al. |
| 9,767,880 | B1 | 9/2017 | Carman |
| 10,381,357 | B2 | 8/2019 | Karda et al. |
| 10,748,931 | B2 | 8/2020 | Karda et al. |
| 2004/0266031 | A1 | 12/2004 | Inomata |
| 2006/0118844 | A1 | 6/2006 | Kijima et al. |
| 2006/0175660 | A1 | 8/2006 | Cheng et al. |
| 2010/0302848 | A1 | 12/2010 | Mikhalev |
| 2010/0314676 | A1 | 12/2010 | Akiyama et al. |
| 2011/0002159 | A1 | 1/2011 | Suzuki et al. |
| 2014/0035018 | A1 | 2/2014 | Lee |
| 2014/0340952 | A1 | 11/2014 | Ramaswamy et al. |
| 2015/0054063 | A1 | 2/2015 | Karda et al. |
| 2016/0207761 | A1 | 7/2016 | Alam et al. |
| 2017/0133478 | A1 | 5/2017 | Ramaswamy et al. |
| 2017/0162587 | A1 | 6/2017 | Chavan et al. |
| 2018/0061835 | A1 | 3/2018 | Yang et al. |
| 2018/0174647 | A1 | 6/2018 | Takahashi et al. |
| 2019/0067298 | A1 | 2/2019 | Karda et al. |
| 2019/0181147 | A1 | 6/2019 | Liu et al. |
| 2019/0348424 | A1 | 11/2019 | Karda et al. |
| 2020/0328220 | A1* | 10/2020 | Derner ............... G11C 11/2259 |

FOREIGN PATENT DOCUMENTS

| | | | |
|---|---|---|---|
| WO | WO PCT/US2020/021115 | 6/2020 | |
| WO | WO PCT/US2020/021115 | 8/2021 | |

OTHER PUBLICATIONS

Muller et al., "High Endurance Strategies for Hafnium Oxide Based Ferroelectric Field Effect Transistor", IEEE 16th Non-Volatile Memory Technology Symposium (NVMTS), Oct. 17-19, 2016, United States, 7 pages.

Yeo et al., "Direct Tunneling Gate Leakage Current in Transistors with Ultrathin Silicon Nitride Gate Dielectric", IEEE Electron Device Letters vol. 21, Issue 11, Nov. 2000, United States, pp. 540-542.

Yurchuk et al., "Impact of Scaling on the Performance of HfO2-Based Ferroelectric Field Effect Transistors", IEEE Transactions on Electron Devices, vol. 61, No. 11, Nov. 2014, United States, pp. 3699-3706.

Zhang et al., "3.3 V Write-Voltage Ir/Ca0.2Sr0.8Bi2Ta2O9/HfO2/Si Ferroelectric-Gate Field-Effect Transistors with 109 Endurance and Good Retention", Japanese Journal of Applied Physics vol. 56, Feb. 27, 2017, Japan, 5 pages.

Zhang et al., "64 kbit Ferroelectric-Gate-Transistor-Integrated NAND Flash Memory with 7.5 V Program and Long Data Retention", Japanese Journal of Applied Physics vol. 51, Apr. 20, 2012, Japan, 7 pages.

* cited by examiner

INTEGRATED ASSEMBLIES HAVING TRANSISTOR BODY REGIONS COUPLED TO CARRIER-SINK-STRUCTURES; AND METHODS OF FORMING INTEGRATED ASSEMBLIES

RELATED PATENT DATA

This patent resulted from a divisional of U.S. patent application Ser. No. 16/810,009, now U.S. Pat. No. 11,348,932, filed Mar. 5, 2020, which claims priority to and the benefit of U.S. Provisional Patent Application Ser. No. 62/814,689, filed Mar. 6, 2019, the disclosure of each being hereby incorporated herein by reference.

TECHNICAL FIELD

Integrated assemblies having transistor body regions coupled to carrier-sink-structures; and methods of forming integrated assemblies.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of an array, and the access lines may conductively interconnect memory cells along rows of the array.

Field effect transistors (FETs) may be utilized as access devices of the memory cells. The transistors have channel regions (body regions) between source/drain regions. During programming operations, the source/drain regions are gatedly coupled to one another through the channel regions. Carriers (holes and electrons) migrate into and out of the body regions. Rapid cycling (i.e., multiple read/write operations occurring over a short duration) can create problems in which excess carriers are not adequately discharged from the body regions, and thus undesirably accumulate in the body regions. Such problems are becoming more difficult to overcome with increasing levels of integration. It is desired to develop transistors which may be utilized in applications requiring rapid cycling of read/write operations, and yet which are scalable to ever-increasing levels of integration.

BRIEF DESCRIPTION OF THE DRAWINGS

FIG. 1 is a diagrammatic top view of the assembly. FIGS. 1A and 1B are diagrammatic cross-sectional side views along the lines A-A and B-B, respectively, of FIG. 1. FIG. 1B is along the line B-B of FIG. 1A, and FIG. 1A is along the line A-A of FIG. 1B.

FIG. 4 is a diagrammatic sectional top-down view along the line C-C of FIGS. 4A and 4B. FIGS. 4A and 4B are diagrammatic cross-sectional side views along the lines A-A and B-B, respectively, of FIG. 4. FIG. 4B is along the line B-B of FIG. 4A, and FIG. 4A is along the line A-A of FIG. 4B.

FIG. 5 is a diagrammatic top view of the assembly. FIGS. 5A and 5B are diagrammatic cross-sectional side views along the lines A-A and B-B, respectively, of FIG. 5. FIG. 5B is along the line B-B of FIG. 5A, and FIG. 5A is along the line A-A of FIG. 5B.

FIG. 6 is a diagrammatic sectional top-down view along the line C-C of FIGS. 6A and 6B. FIGS. 6A and 6B are diagrammatic cross-sectional side views along the lines A-A and B-B, respectively, of FIG. 6. FIG. 6B is along the line B-B of FIG. 6A, and FIG. 6A is along the line A-A of FIG. 6B.

FIGS. 8A-17A are diagrammatic cross-sectional side views along the lines A-A of FIGS. 8-17. FIGS. 8B-17B are diagrammatic cross-sectional side views along the lines B-B of FIGS. 8-17.

DETAILED DESCRIPTION OF THE ILLUSTRATED EMBODIMENTS

Figure 1:
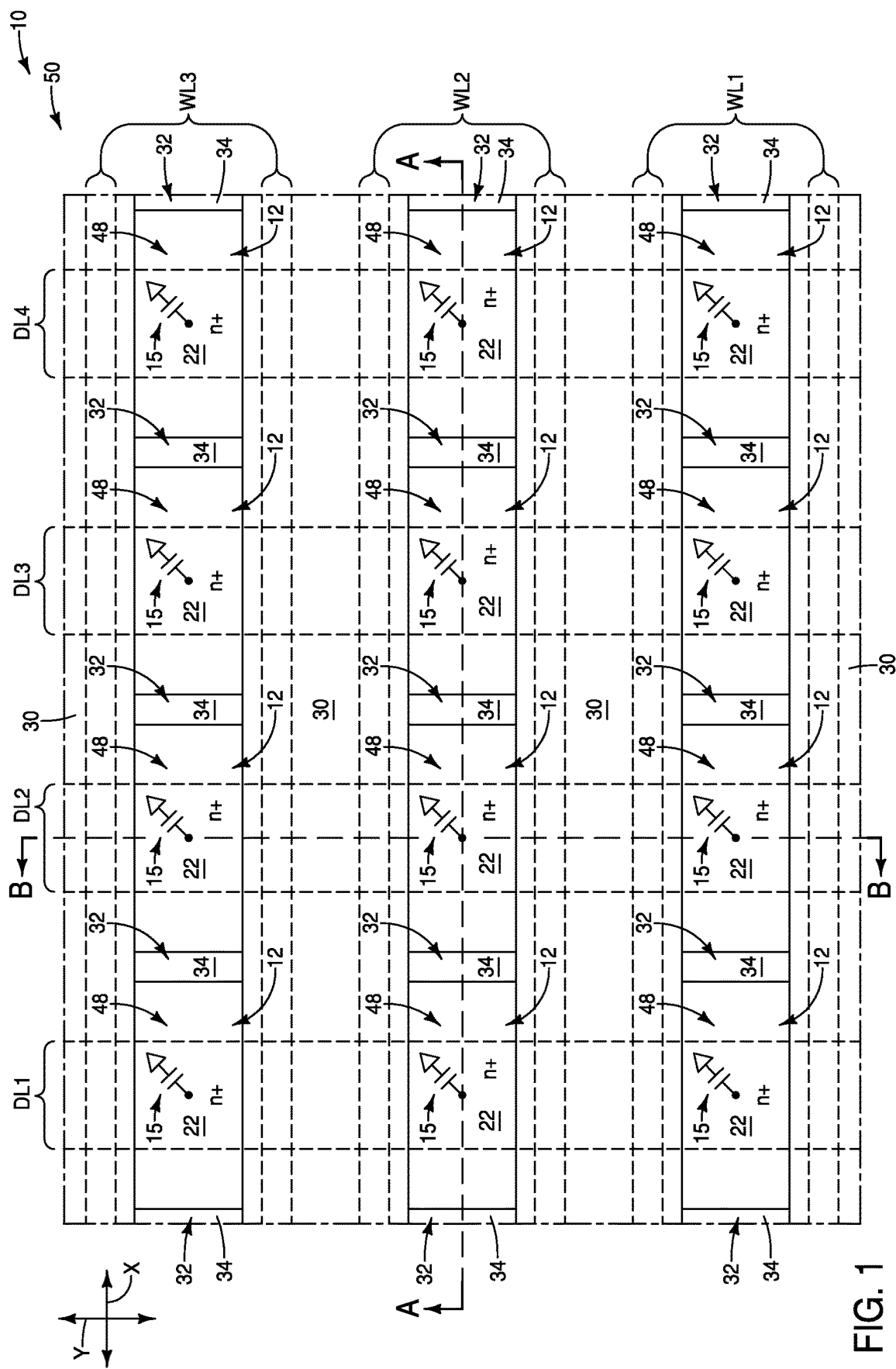
FIGS. 1, 1A and 1B are views of a region of an example integrated assembly comprising example memory cells.

Conventional transistors may be p-channel devices (i.e., may have p-type source/drain regions, and have the channels operated to conduct holes between the p-type source/drain regions), or may be n-channel devices (i.e., may have n-type source/drain regions, and have the channels operated to conduct electrons between n-type source/drain regions). Some embodiments include recognition that a problem with conventional transistors utilized in memory arrangements is that the body regions of such transistors are electrically floating. Such can become problematic during read/write operations, in that a limiting factor in the cycle time of such operations may be the rate at which excess carrier may be removed (drained) from within the body regions of the transistors (e.g., the rate at which excess holes are removed from the body regions of n-channel transistors). If the excess carrier accumulates within the body regions of the transistors, the threshold voltage ($V_T$) and off-current ($I_{OFF}$) may be altered, which may render the transistors inoperable for intended applications. Some embodiments include a carrier-sink directly coupled with the body regions of transistors to enable rapid discharge of excess charge from the body regions. Such may improve performance (e.g., decrease cycle time). Example embodiments are described with reference to FIGS. 1-17.

As a preliminary matter, it is noted that some of the figures show various different dopant levels; and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. Regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Figure 1A:
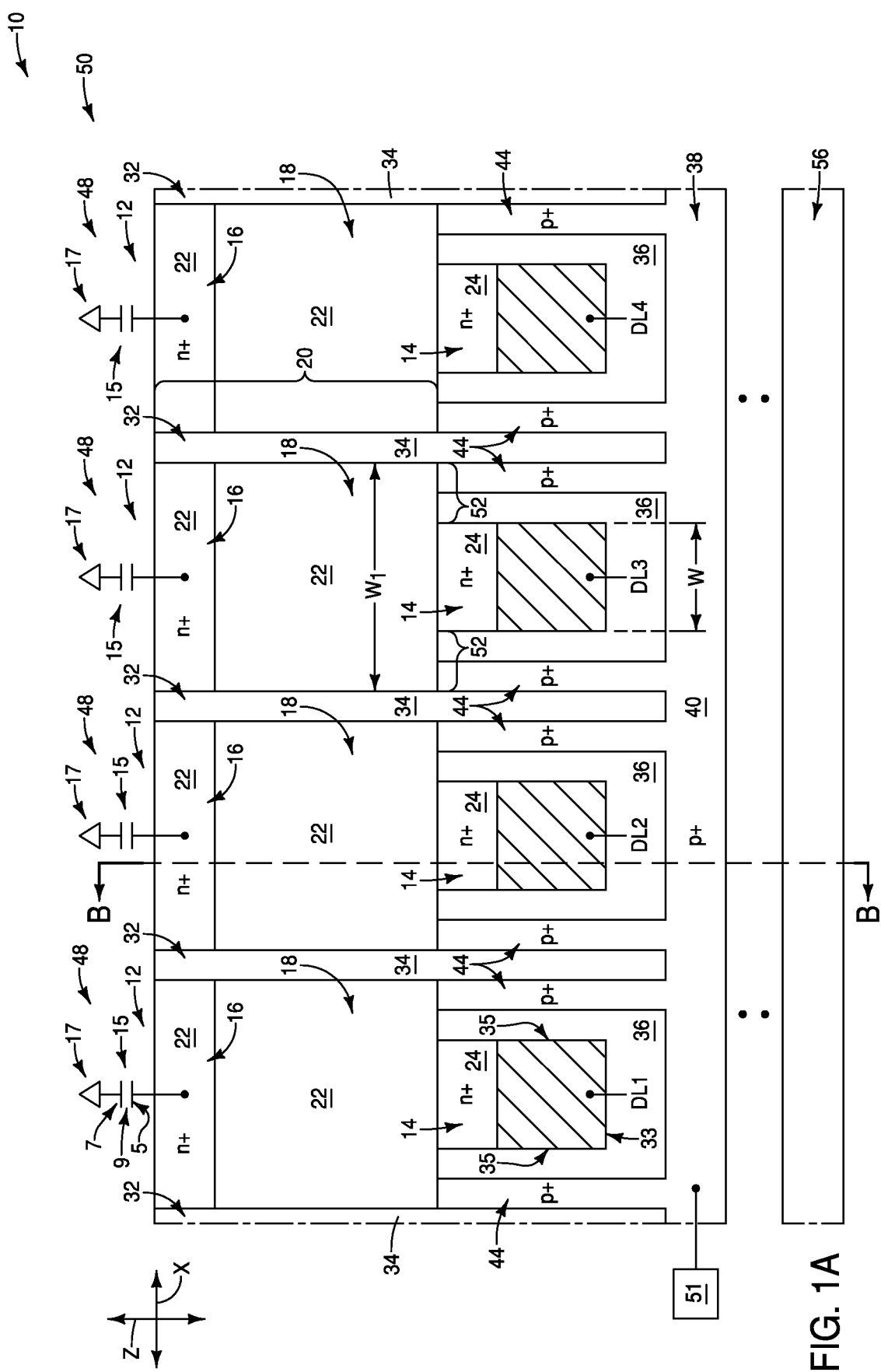
Figure 1B:
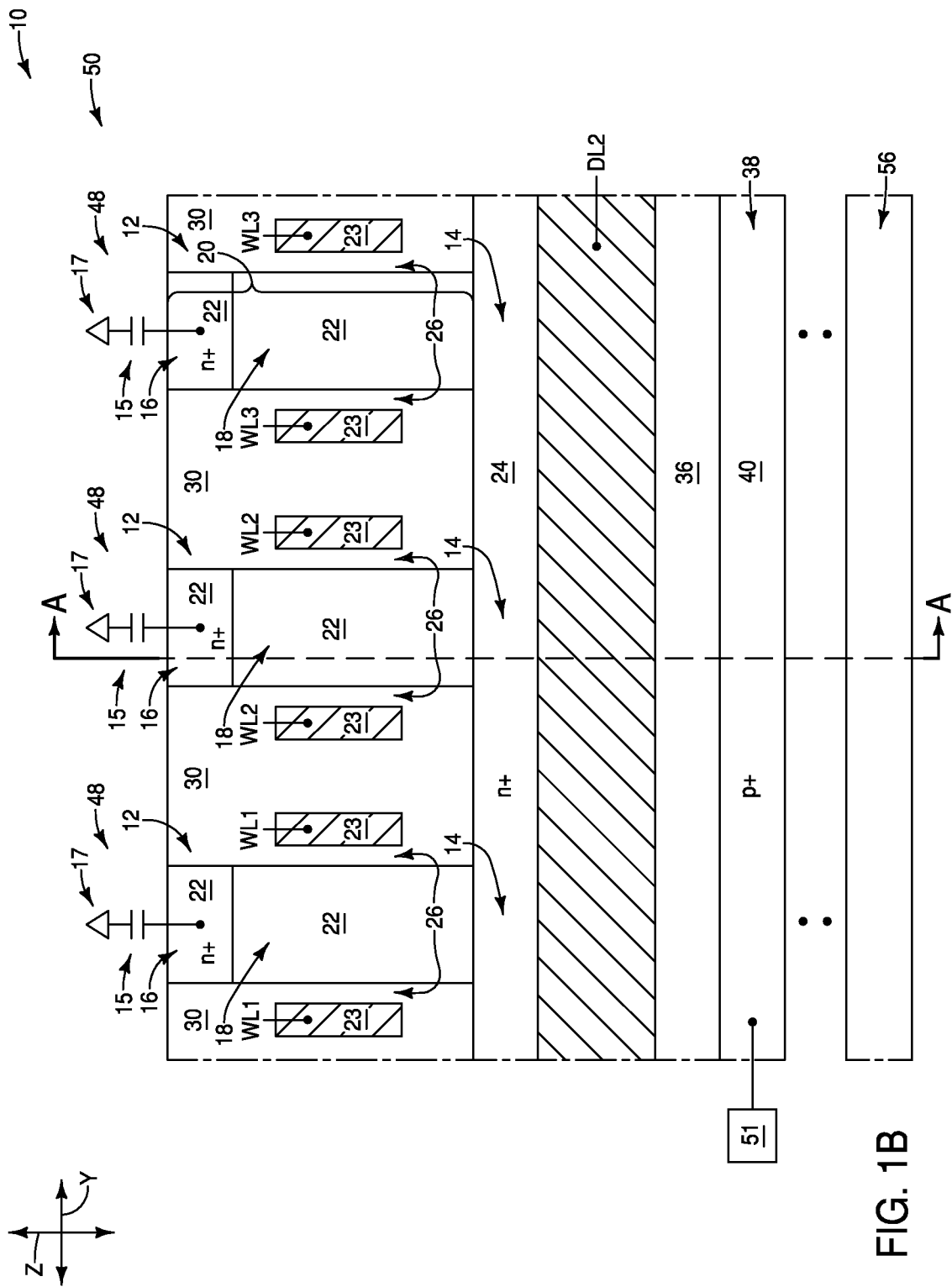

Referring to FIGS. 1-1B, a region of an integrated assembly (construction) 10 is shown in top view (FIG. 1) and a pair of cross-sectional side views (FIGS. 1A and 1B). The construction includes a plurality of wordlines (WL1, WL2 and WL3), with such wordlines being shown in dashed-line (i.e. phantom) view in the top view of FIG. 1 to indicate that they are beneath other materials. Each of the wordlines comprises a pair of conductive structures which extend parallel to one another. The conductive structures of each wordline are coupled to one another in a location outside of the views of FIGS. 1-1B. In other embodiments, the wordlines may comprise only a single conductive structure, may comprise gate-all-around configurations, or may comprise any other suitable configurations.

The construction also includes a plurality of digit lines (DL1, DL2, DL3 and DL4), with such digit lines being shown in dashed-line (i.e. phantom) view in the top view of FIG. 1 to indicate that they are beneath other materials.

The digit lines may be considered to extend along a first direction (a y-axis direction), and the wordlines may be considered to extend along a second direction (an x-axis direction), with the second direction crossing the first direction. In the shown embodiment, the second direction is substantially orthogonal to the first direction (with the term "substantially orthogonal" meaning orthogonal to within reasonable tolerances of fabrication and measurement). The terms "first direction" and "second direction" are arbitrary; and in some embodiments the x-axis direction may be referred to as the first direction, while the y-axis direction is referred to as the second direction.

The assembly 10 includes transistors 12, which are arranged in an array. In some embodiments, the wordlines (e.g., WL1) may be considered to extend along rows of such array, and the digit lines (e.g., DL1) may be considered to extend along columns of the array.

Each of the transistors 12 comprises a lower (i.e. bottom) source/drain region 14, and an upper (i.e. top) source/drain region 16. In some embodiments, one of the lower and upper source/drain regions of an individual transistor 12 may be referred to as a first source/drain region, and the other may be referred to as a second source/drain region. In the illustrated embodiment, the source/drain regions 14 and 16 are shown to be n-type doped; and accordingly the transistors 12 are n-channel devices. In other embodiments, the source/drain regions 14 and 16 may be p-type doped so that the transistors 12 are p-channel devices.

Each of the upper source/drain regions 16 is electrically coupled with a capacitor 15. Each of the capacitors 15 has a node coupled with a reference voltage 17. Such reference voltage may be any suitable reference voltage, and in some embodiments may be ground or Vcc/2. The capacitors 15 are representative of storage elements which may be utilized in memory cells, with the term "storage element" meaning any suitable device having at least two detectable states. In some embodiments, suitable storage elements may be, for example, capacitors, resistive-memory devices, conductive-bridging devices, phase-change-memory (PCM) devices, programmable metallization cells (PMCs), etc.

In the shown embodiment in which the storage elements 15 are capacitors, each capacitor may be considered to comprise a first node 5 (labeled relative to one of the capacitors of FIG. 1A), a second node 7, and capacitor dielectric material 9 between the first and second nodes.

The lower source/drain regions 14 are electrically coupled with the digit lines (e.g., DL1); and in the shown embodiment are directly against top surfaces of the digit lines.

Each transistor 12 has a transistor body region 18 between the source/drain regions 14 and 16. In some embodiments, the upper source/drain regions 16 and body regions 18 may be comprised by vertically-extending pillars 20 of semiconductor material 22 (only one of the pillars 20 is labeled in each of FIGS. 1A and 1B in order to simplify the drawings). The vertically-extending pillars may extend along an illustrated z-axis.

The bottom source/drain regions 14 extend within lines of semiconductor material 24. The semiconductor materials 22 and 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The semiconductor materials 22 and 24 may be a same composition as one another or may be different compositions relative to one another. In some embodiments, the semiconductor materials 22 and 24 may both comprise, consist essentially of, or consist of silicon. Junctions between the source/drain regions (14, 16) and the body regions (18) may be in any suitable locations.

The wordlines (e.g., WL1) comprise conductive wordline material 23. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The wordlines (e.g., WL1) are adjacent the transistor body regions 18; and are spaced from the body regions 18 by intervening regions comprising gate dielectric material (gate insulative material) 26. The gate dielectric material may comprise any suitable composition(s); and in some embodiments may comprise, consist essentially of, or consist of one or more of silicon dioxide, high-k dielectric material and low-k dielectric material (with the term high-k meaning a dielectric constant greater than that of silicon dioxide, and the term low-k meaning a dielectric constant lower than that of silicon dioxide). In some embodiments, the gate insulative material 26 does not comprise ferroelectric material.

In operation, the body regions 18 comprise channel regions of the transistors 12, and regions of the wordlines adjacent the body regions are utilized as transistor gates to gatedly couple the source/drain regions 14 and 16 to one another through the channel regions. The coupling of the source/drain regions may be accomplished by selectively providing voltage along the wordlines to induce electric fields within the channel regions, with such electric fields causing the channel regions to conductively couple the source/drain regions 14 and 16 with one another.

Insulative material 30 is over and between the wordlines. The insulative material 30 may comprise any suitable composition(s); and in some embodiments may comprise, consist essentially of, or consist of silicon oxide. The insulative material 30 is configured as lines extending along a same direction as the wordlines (e.g., WL2). The insulative material 30 separates neighboring transistor body regions 18 from one another along the y-axis direction (shown in FIG. 1B).

Insulative panels 32 separate neighboring transistor body regions 18 from one another along the x-axis direction (shown in FIG. 1A). Such panels may extend linearly along the same direction as the digit lines (e.g., DL1). The panels 32 comprise insulative material 34. The insulative material 34 may comprise any suitable composition(s); and in some embodiments may comprise, consist essentially of, or consist of silicon oxide.

The digit lines (e.g., DL1) each comprise a bottom surface 33 and sidewall surfaces 35 (labeled only relative to the digit line DL1 in FIG. 1A in order to simplify the drawings). The digit lines (e.g., DL1) extend into an insulative material 36. Regions of the insulative material 36 are beneath the digit lines, and other regions of the insulative material 36 are along the sidewall surfaces 35 of the digit lines.

A carrier-sink-structure 38 is beneath the insulative material 36. In some embodiments, the digit lines (e.g., DL1) may be considered to be examples of conductive structures which are over the carrier-sink-structure 38. In the shown embodiment, such conductive structures are spaced from the carrier-sink-structure 38 by insulative regions comprising the insulative material 36.

The carrier-sink-structure may be a drain for excess carriers (e.g., holes or electrons). The illustrated transistors 12 are n-channel devices, and the illustrated carrier-sink-structure 38 is p-type and configured as a drain for holes. In other embodiments the transistors may be p-channel devices, and the carrier-sink-structure 38 may be n-type and configured as a drain for electrons. The carrier-sink-structure may be doped with any suitable dopant type to any suitable dopant concentration which enables desired operational characteristics of the carrier-sink-structure to be achieved.

The carrier-sink-structure 38 comprises semiconductor material 40. The semiconductor material 40 may comprise any suitable composition(s); including, for example, one or more of silicon, germanium, III/V semiconductor material, semiconductor oxides (e.g., oxide comprising one or more of indium, gallium and zinc), etc. The semiconductor material 40 may comprise a same semiconductor composition as one or both of the semiconductor material 22 and 24, or may comprise a different semiconductor composition relative to one or both of the semiconductor materials 22 and 24. In some embodiments, the semiconductor materials 22, 24 and 40 may all comprise, consist essentially of, or consist of silicon.

The semiconductor material 40 of the carrier-sink-structure 38 is shown doped to a p+ dopant level; and in some embodiments may be doped to a concentration of at least about $1\times10^{20}$ atoms/cm$^3$ with one or more appropriate p-type dopants.

Extension regions (i.e., extensions) 44 extend from the carrier-sink-structure 38 to the transistor body regions 18 (or to at least a vertical level of the transistor body regions), as shown in FIG. 1A. The extension regions 44 are shown comprising a same semiconductor material 40 as the carrier-sink-structure 38. In other embodiments, the extension regions 44 may comprise a different semiconductor material than the carrier-sink-structure 38.

The extension regions 44 are shown doped to a "p+" dopant level. In some embodiments, the extension regions 44 may be doped to a concentration of at least about $1\times10^{20}$ atoms/cm$^3$ with one or more appropriate p-type dopants. The extension regions 44 have a same dopant type as the carrier-sink-structure 38. Accordingly, in some embodiments the extension regions 44 may be p-type (as shown), and in other embodiments they may be n-type. The extension regions may be doped to any suitable dopant type and concentration which achieves desired operational characteristics.

The transistors 12 and storage elements 15 may be considered together to be comprised by memory cells 48; with such memory cells being assembled in a memory array 50. Each memory cell is uniquely addressed a combination of one of the digit lines (e.g., DL1) and one of the wordlines (e.g., WL1).

An individual memory cell 48 may be programmed (i.e., written) into a first memory state (a so-called "1" state) by operating the associated wordline and digit line to store charge on the capacitor 15. An individual memory cell may be programmed into a second memory state (a so-called "0" state) by operating the associated wordline and digit line to discharge the capacitor 15. An individual memory cell may be read by operating the associated wordline and digit line to discharge any stored charge from the memory cell to a detection system to thereby determine if the memory cell was in the first memory state or the second memory state.

In conventional memory cells, excess carriers (e.g., excess holes in some applications of the illustrated n-channel devices) may accumulate along the body regions of the transistors in applications in which operations (i.e., write operations and/or read operations) are rapidly cycled. In contrast, the extensions 44 of the illustrated example memory cells 48 are configured to drain excess carriers from the body regions 18 of the memory cells to the carrier-sink-structure 38, and to thereby enable rapid cycling of operations associated with the memory cells.

The carrier-sink-structure 38 is shown to be coupled to a device 51 which provides appropriate electrical properties to the carrier-sink-structure 38 to enable excess carriers to readily flow from the body regions 18 to the carrier-sink-structure. In some embodiments, the device 51 may be considered to be a voltage source configured to provide a reference voltage. The reference voltage may ground, greater than zero (i.e., a positive reference voltage), or less than zero (i.e., a negative reference voltage) depending on whether the carriers are holes or elections, and depending on operational parameters of the memory cells 48. In some embodiments, a constant bias may be maintained on the p+ material 40 (the region 38) with the device 51 during operation of body regions coupled with the region 38.

The memory array 50 is supported by a base 56. The base 56 may comprise semiconductor material; and may, for example, comprise, consist essentially of, or consist of monocrystalline silicon. The base 56 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 56 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 56 and the carrier-sink-structure 38 to indicate that there may be other materials and/or components between the base 56 and the carrier-sink-structure 38. However, it is to be understood that the semiconductor material 40 of the carrier-sink-structure 38 may be coextensive with semiconductor material of the base 56 in some embodiments.

In the embodiment of FIGS. 1-1B, the digit lines (e.g., DL3) may be considered to extend along a first direction (the y-axis direction), and to have width W along a cross-section orthogonal to the first direction (shown in FIG. 1A). The lower source/drain regions 14 have the same width (W) as the digit lines along the cross-section. The transistor body regions 18 and the upper source/drain regions 16 have a width $W_1$ along the cross-section, with the width $W_1$ being greater than the width W. In some embodiments, the transistor body regions 18 may be considered to comprise ledge regions 52 (only two of which are labeled in FIG. 1A in order to simplify the drawing). The ledge regions 52 extend laterally beyond the lower source/drain regions 14 along the cross-section of FIG. 1A. The extensions 44 directly contact the undersides of the transistor body regions 18 along the ledge regions 52.

Figure 2:
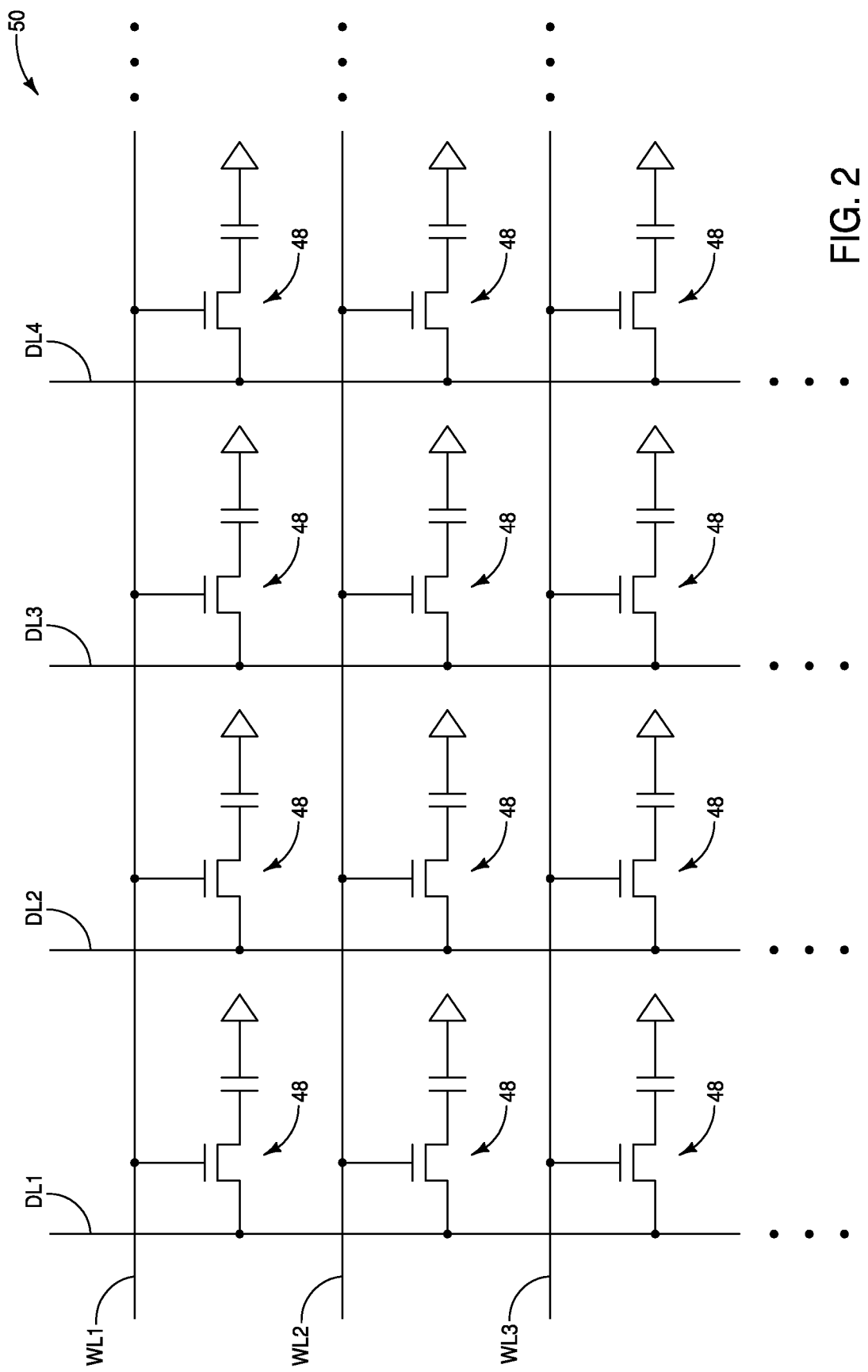
FIG. 2 is a diagrammatic schematic view of a region of an example memory array.

The memory cells 48 may be considered to be examples of one-transistor-one-capacitor (1T-1C) devices, in that each memory cell comprises a single transistor 12 in combination with a single capacitor 15. FIG. 2 schematically illustrates a portion of the memory array 50, and shows such memory array comprising the digit lines DL1, DL2, DL3 and DL4, together with the wordlines WL1, WL2 and WL3. Each of the memory cells 48 within the memory array is uniquely addressed through a combination of one of the wordlines and one of the digit lines. The memory array may include any suitable number of memory cells 48; and in some embodiments may comprise hundreds, millions, tens of millions, etc., of memory cells.

Figure 3:
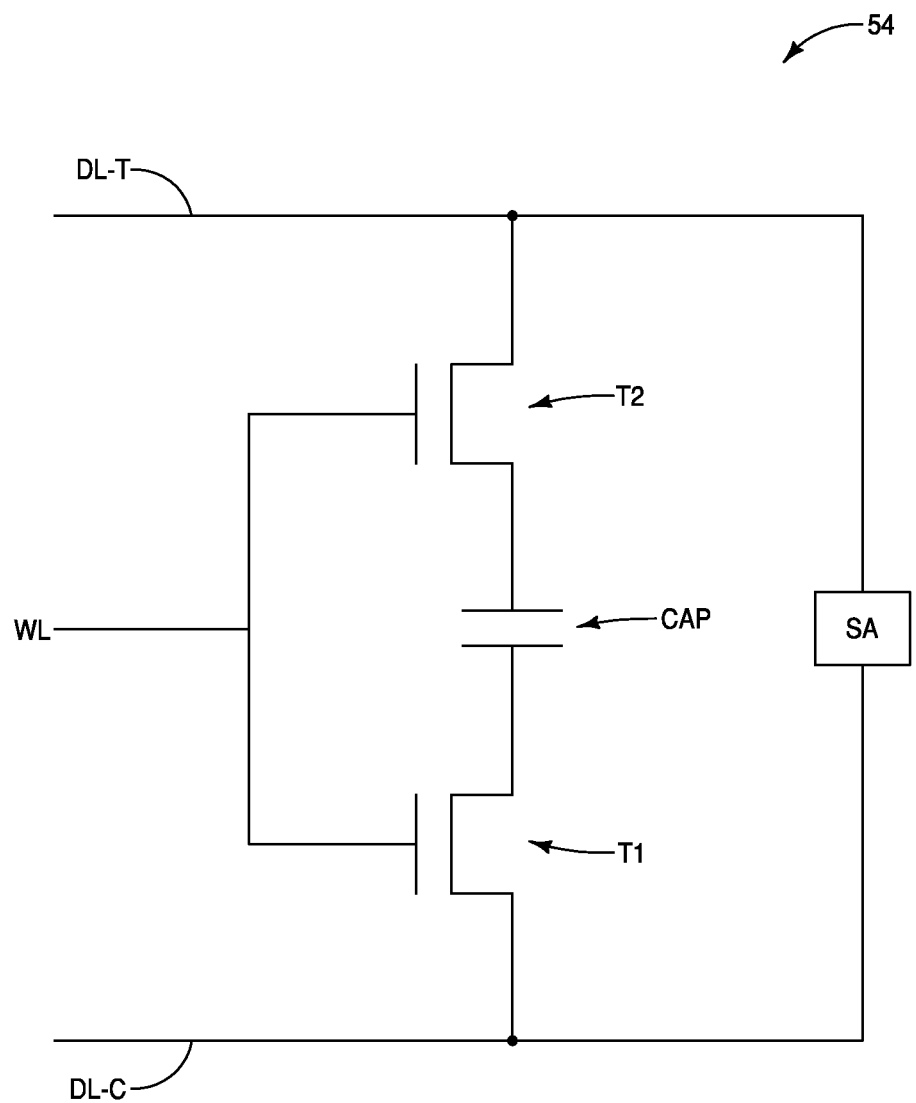
FIG. 3 is a diagrammatic schematic view of a region of an example assembly comprising an example two-transistor-one-capacitor (2T-1C) memory cell.

In some embodiments, carrier-sink-structures and extension regions analogous to those of FIGS. 1-1B may be incorporated into two-transistor-one-capacitor (2T-1C) memory cells. An example 2T-1C memory cell configuration 54 is schematically illustrated in FIG. 3. The 2T-1C configuration includes two transistors (T1 and T2) and a capacitor (CAP). A source/drain region of T1 connects with a first node of the capacitor (CAP), and the other source/drain region of T1 connects with a first comparative digit line (DL-C). A gate of T1 connects with a wordline (WL). A source/drain region of T2 connects with a second node of the capacitor (CAP), and the other source/drain region of T2 connects with a second comparative digit line DL-T. A gate of T2 connects with the wordline (WL). The comparative digit lines DL-T and DL-C extend to sense amplifier circuitry (SA) which compares electrical properties (e.g., voltage) of the two to ascertain a memory state of memory cell 54. The comparative digit lines DL-T and DL-C may be considered to be a paired set (DL-1/DL-C) which comprises a true digit line (DL-T) and a complementary digit line (DL-C). The terms "true" and "complementary" are arbitrary. The electrical values of the true and complementary digit lines of the paired set are utilized together during reading/writing operations of memory cells (e.g., the memory cell 54) associated with such set.

Figure 4:
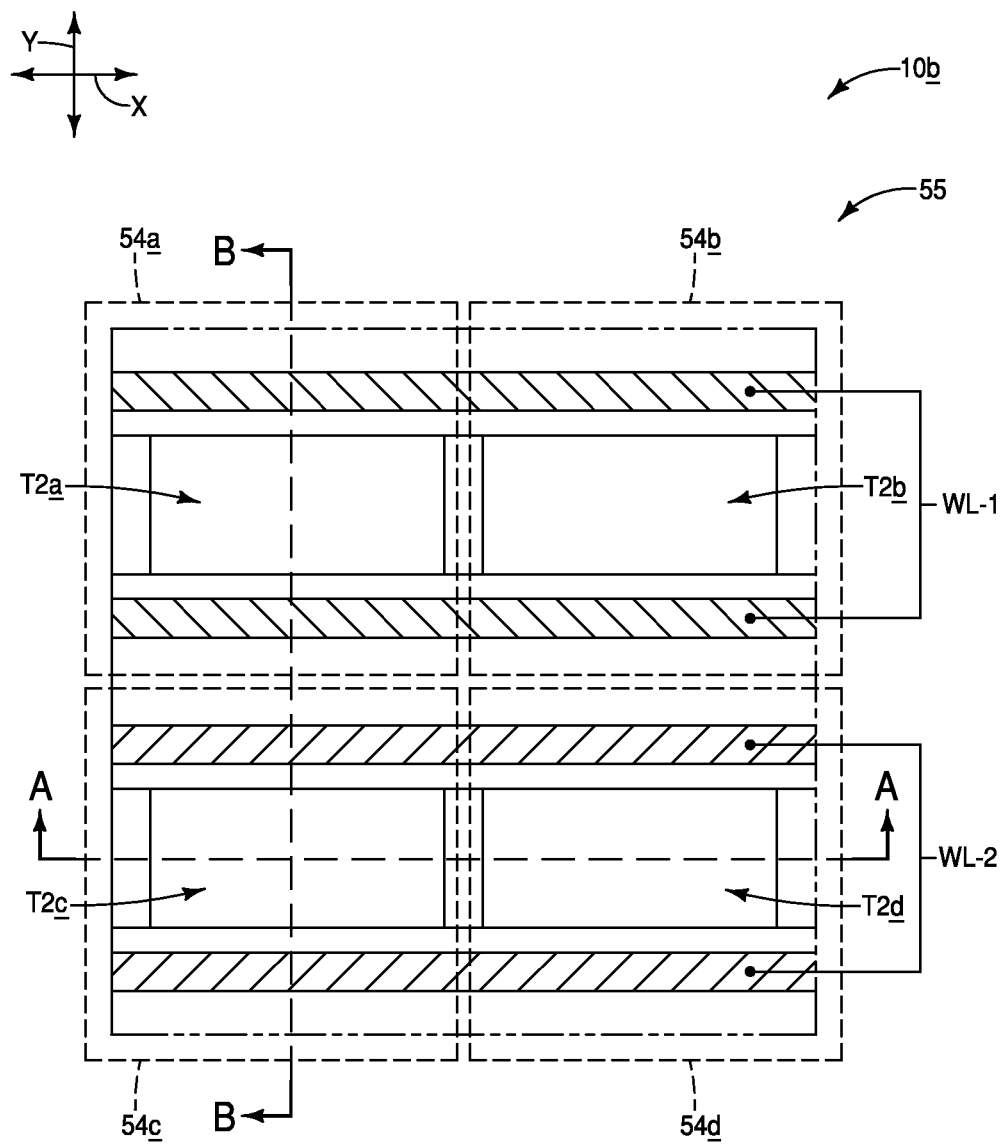
FIGS. 4, 4A and 4B are views of a region of an example integrated assembly comprising example memory cells.
Figure 4A:
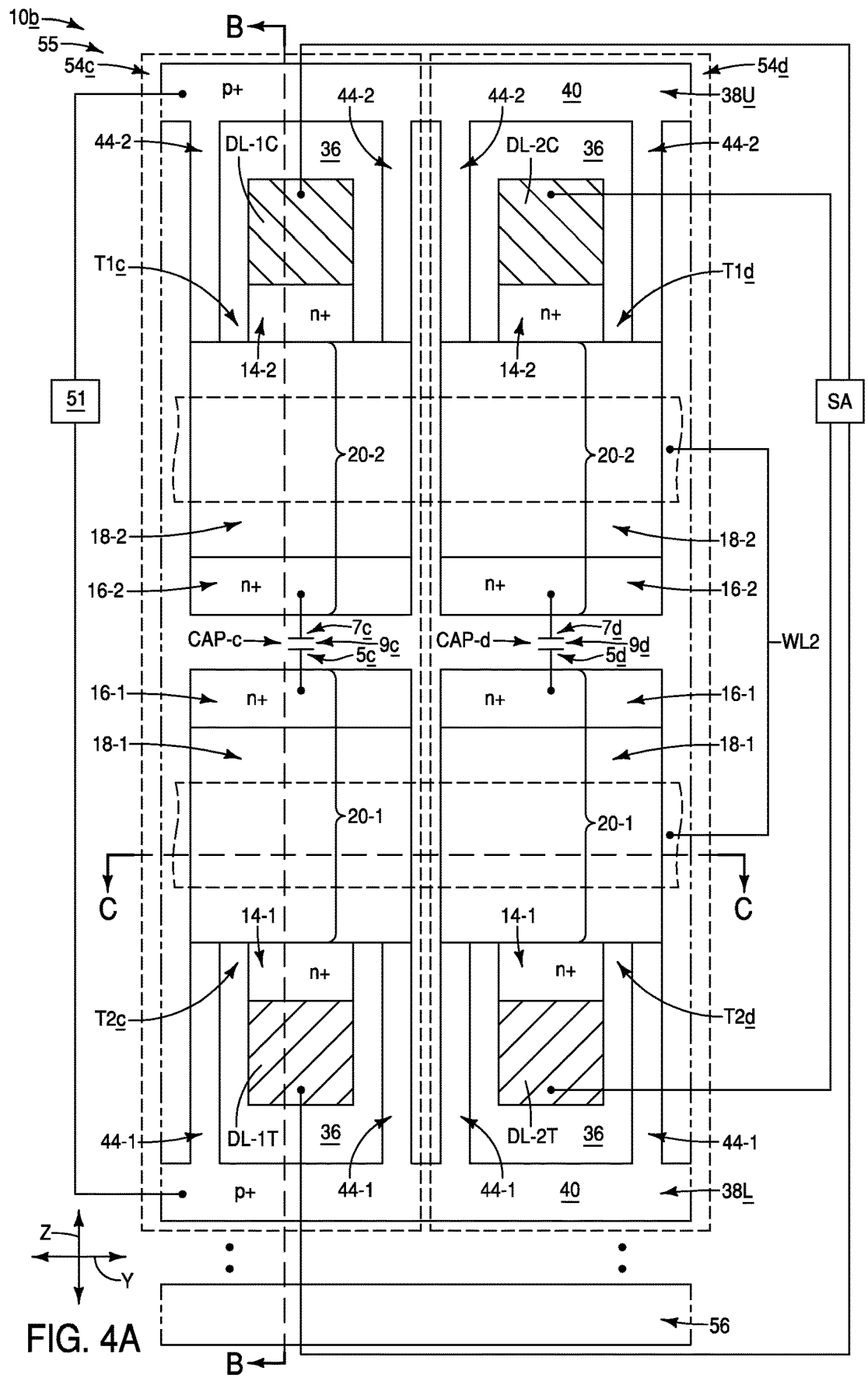
Figure 4B:
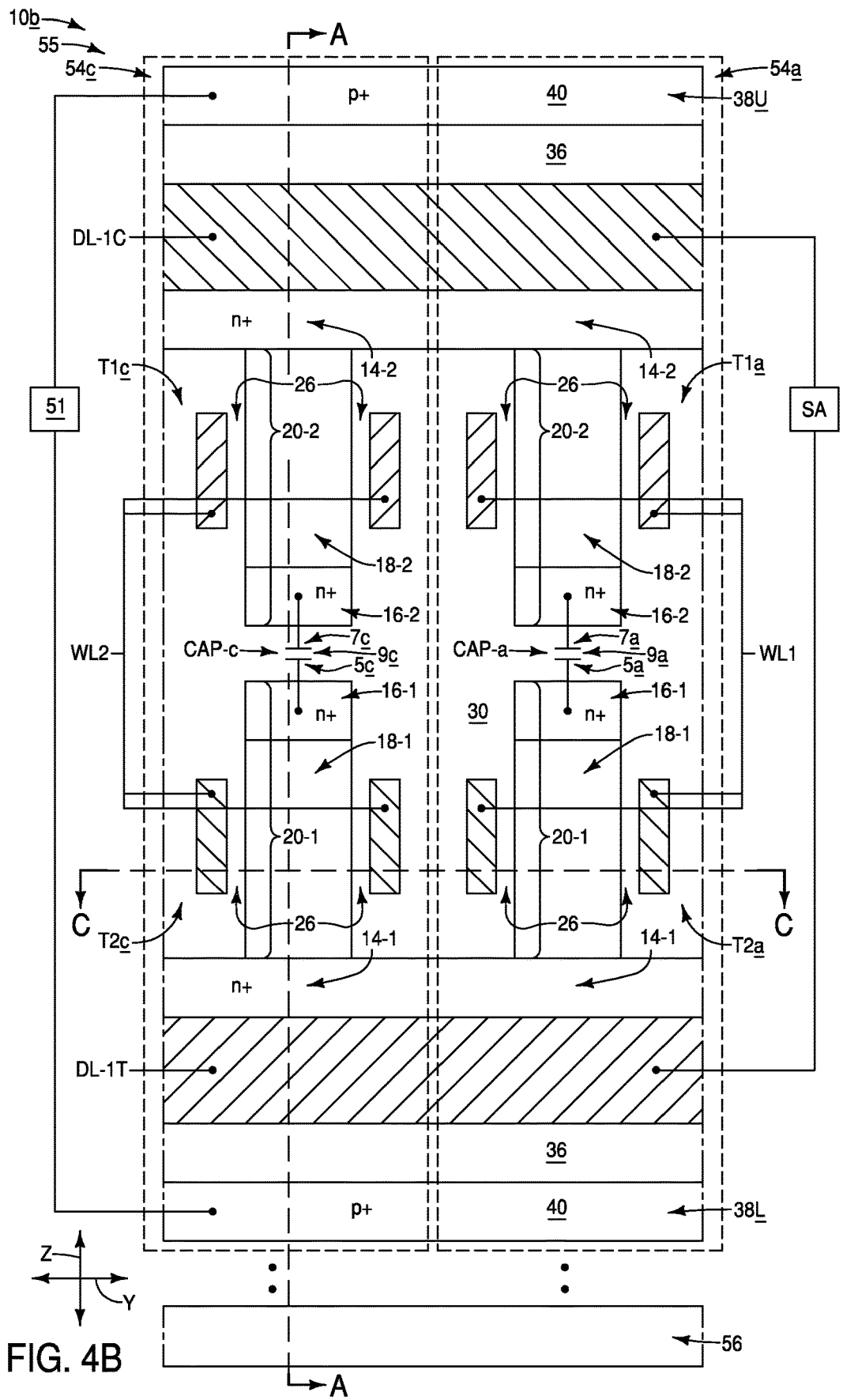

FIGS. 4-4B show regions of an example integrated assembly (construction) 10b illustrating example 2T-1C memory cells 54a, 54b, 54c and 54d of a memory array 55. The memory cell 54a comprises first and second transistors T1a and T2a, together with a capacitor CAP-a. Similarly, the memory cell 54b comprises first and second transistors T1b and T2b, together with the capacitor CAP-b (with the first transistor T1b and the capacitor CAP-b not being shown in FIGS. 4-4B); the memory cell 54c comprises first and second transistors T1c and T2c, together with the capacitor CAP-c; and the memory cell 54d comprises first and second transistors T1d and T2d, together with the capacitor CAP-d.

The capacitor CAP-a has first and second nodes 5a and 7a, respectively, and has capacitor dielectric material 9a between the first and second nodes. Similarly, the capacitor CAP-c has first and second nodes 5c and 7c, respectively, and has capacitor dielectric material 9c between the first and second nodes; and the capacitor CAP-d has first and second nodes 5d and 7d, respectively, and has capacitor dielectric material 9d between the first and second nodes. The capacitor CAP-b would be configured similarly, but is not shown in FIGS. 4-4B.

The first and second transistors of each of the memory cells (e.g., the first and second transistors T1c and T2c of the memory cell 54c) may be considered together to comprise, in ascending order, a first source/drain region 14-1, a second source/drain region 16-1, a third source/drain region 16-2, and a fourth source/drain region 14-2. The first and second transistors also together comprise a first transistor body region 18-1, and a second transistor body region 18-2. The first transistor body regions 18-1 and the second source/drain regions 16-1 are within vertically-extending first pillars 20-1; and the second transistor body regions 18-2 and the third source/drain regions 16-2 are within vertically-extending second pillars 20-2. The first and second pillars 20-1 and 20-2 may comprise the semiconductor material 22 (not labeled in FIGS. 4-4B) described above with reference to FIGS. 1-1B. The first and fourth source/drain regions 14-1 and 14-2 may comprise the semiconductor material 24 (not labeled in FIGS. 4-4B) described above with reference to FIGS. 1-1B.

The capacitors (e.g., CAP-c) have the first nodes (e.g., 5c) coupled with the second source/drain regions 16-1, and have the second nodes (e.g., 7c) coupled with the third source/drain regions 16-2.

The assembly 10b includes the base 56, and a lower carrier-sink-structure 38L over the base. First comparative digit lines DL-1T and DL-2T are over the lower carrier-sink-structure 38L, and are spaced from the lower carrier-sink-structure by the insulative material 36. The first source/drain regions 14-1 are electrically coupled with the first comparative digit lines, and in the shown embodiment are directly against the first comparative digit lines.

Second comparative digit lines DL-1C and DL-2C are over the fourth source/drain regions 14-2, and are electrically coupled with the fourth source/drain regions.

An upper carrier-sink-structure 38U is over the second comparative digit lines, and is spaced from the second comparative digit lines by the insulative material 36.

First extension regions (extensions) 44-1 extend upwardly from the lower carrier-sink-structure 38L to the first transistor body regions 18-1, and second extension regions 44-2 extend downwardly from the upper carrier-sink-structure 38U to the second transistor body regions 18-2. The first and second extension regions 44-1 and 44-2 may be configured to drain excess carriers from the first and second body regions 18-1 and 18-2 in a manner similar to that described above relative to the extension regions 44 of the embodiment of FIGS. 1-1B.

A first wordline WL1 extends along the memory cells 54a and 54b; and a second wordline WL2 extends along the memory cells 54c and 54d. The first wordline WL1 has components adjacent each of the body regions 18-1 and 18-2 of the memory cells gated by such wordline, and similarly the second wordline WL2 has components adjacent each of the body regions 18-1 and 18-2 of the memory cells gated by such wordline. The wordlines are spaced from the body regions by intervening insulative regions comprising the gate dielectric material 26. Regions of the second wordline WL2 are shown in dashed line (phantom view) relative to FIG. 4A since the regions are out of the plane of the view.

The true and complementary digit lines DL-1T and DL-1C form a first paired set DL-1C/DL-1T, and the true and complementary digit lines DL-2T and DL-2C form a second paired set DL-2C/DL-2T. The digit lines of each of the paired digit line sets (e.g., DL-1T/DL-1C) are electrically coupled with the sense amplifier SA. The sense amplifier may be utilized to compare electrical properties of the true digit line (e.g., DL-1T) with those of the comparative digit line (e.g., DL-1C) during a READ operation; and/or may be utilized to impart desired electrical properties to the true and complementary comparative digit lines (e.g., DL-1T and DL-1C) during a programming (i.e., WRITE) operation.

Figure 5:
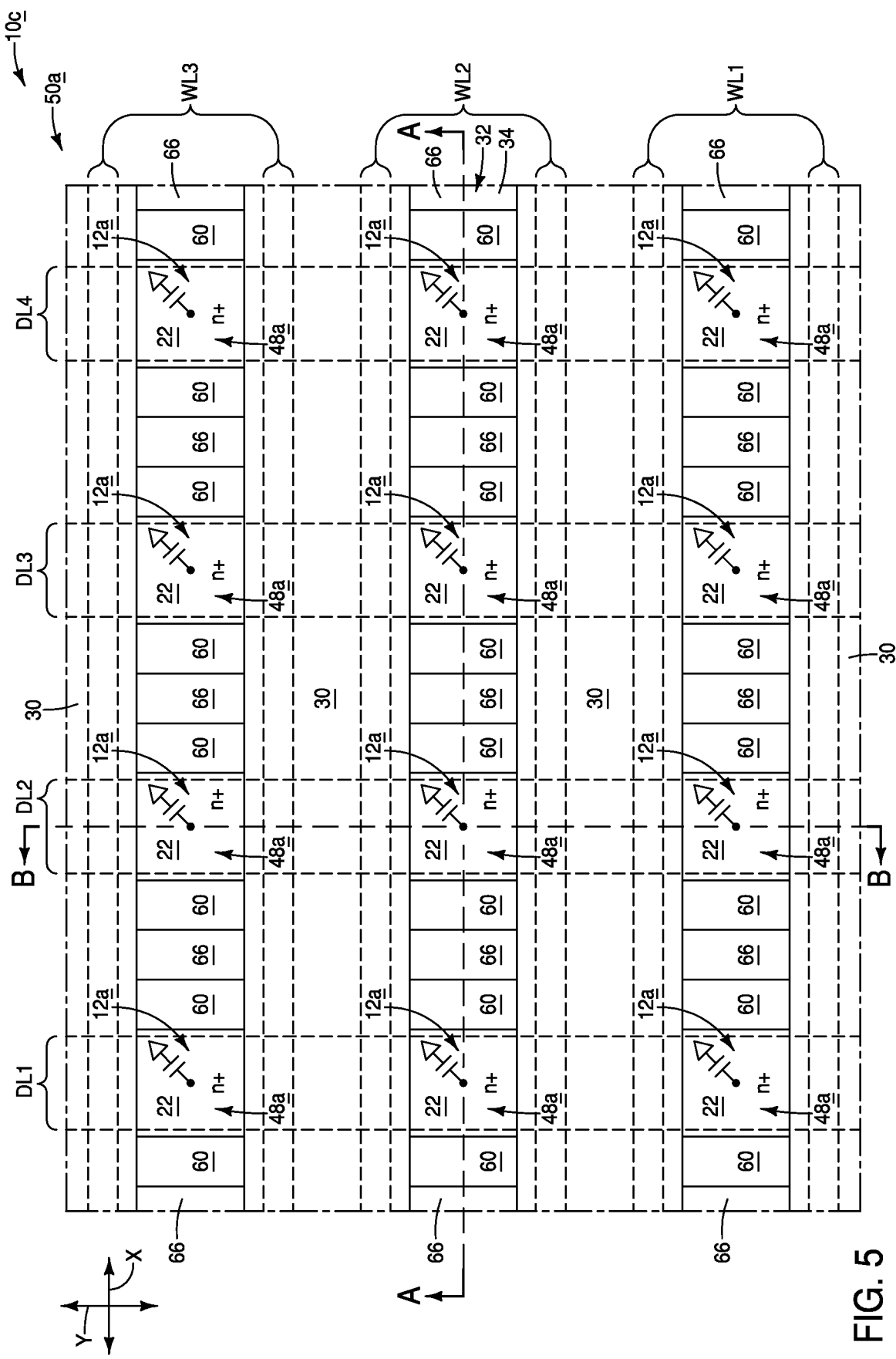
FIGS. 5, 5A and 5B are views of a region of an example integrated assembly comprising example memory cells.
Figure 5A:
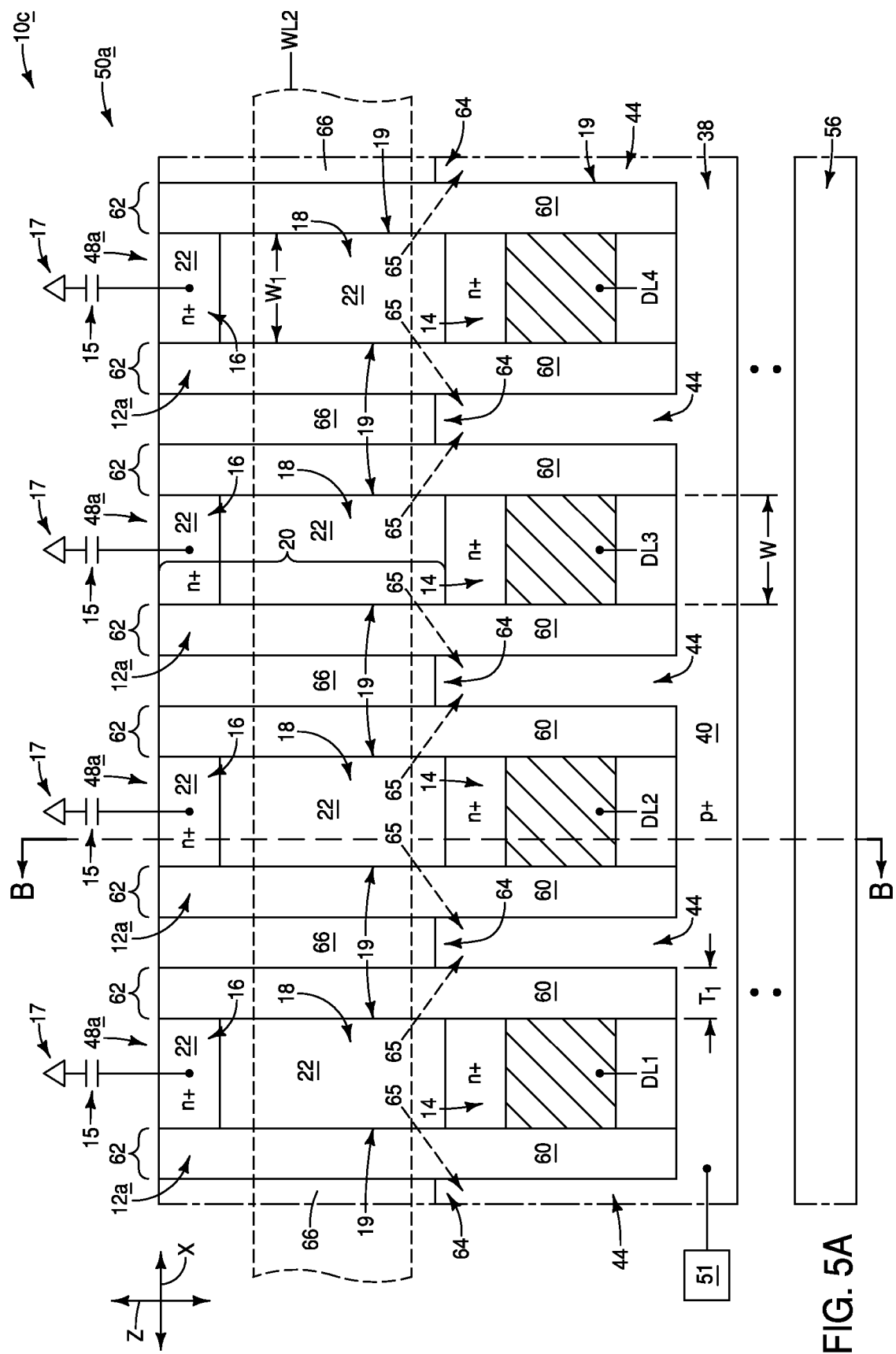
Figure 5B:
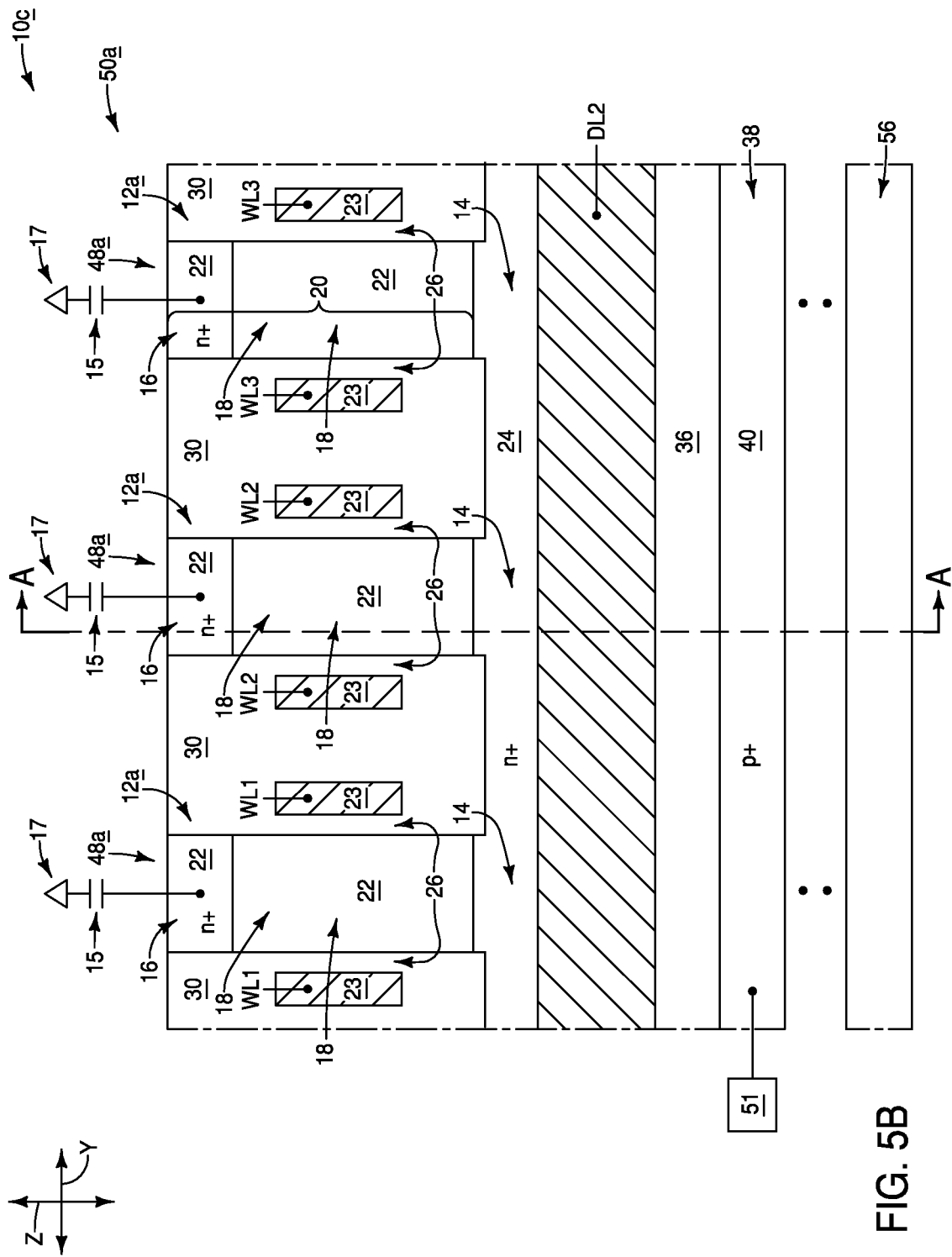

FIGS. 5-5B show regions of an example integrated assembly (construction) 10c illustrating a memory array 50a alternative to the memory array 50 of FIGS. 1-1B. The memory array 50a includes 1T-1C memory cells 48a comprising transistors 12a in combination with the capacitors 15. The transistors 12a have a different configuration than the transistors 12 of FIGS. 1-1B.

The transistors 12a comprise the lower (i.e. bottom) source/drain regions 14, the upper (i.e. top) source/drain regions 16, and the body regions 18 between the source/drain regions 14 and 16. However, in contrast to embodiment of FIG. 1A, the width $W_1$ of the transistor body regions 18 and the upper source/drain regions 16 is the same as the width W of the lower source/drain regions 14 along the cross-section of FIG. 5A.

The wordlines WL1-WL3 extend along rows of the array 50a, and the digit lines DL1-DL4 extend columns of the array 50a.

The wordlines WL1-WL3 have gate regions adjacent the body regions 18, and spaced from the body regions 18 by the gate dielectric material 26.

The dielectric material 30 is over the wordlines WL1-WL3.

The carrier-sink-structure 38 is under the transistors 12, and is supported by the base 56.

The embodiment of FIGS. 5-5B also differs from that of FIGS. 1-1B in that insulative material 60 is provided adjacent sidewalls of the pillars 20, and specifically along sidewalls of the transistor body regions 18. The insulative material 60 may comprise any suitable composition(s); including, for example, silicon dioxide, high-k material (aluminum oxide, zirconium oxide, hafnium oxide, etc.), etc.

The transistor body regions 18 have vertically-extending sidewalls 19 along the cross-section of FIG. 5A. The insulative material 60 forms intervening insulative regions 62 which are laterally adjacent the sidewalls 19, and in the shown embodiment are directly adjacent the sidewalls 19. The insulative regions 62 may have any suitable lateral thicknesses $T_1$; such as, for example, lateral thicknesses within a range of from about 10 Å to about 50 Å.

The extension regions (extensions) 44 have portions 64 laterally adjacent the transistor body regions 18 (i.e., vertically overlapping the transistor body regions), and spaced from the transistor body regions by the intervening insulative regions 62. In operation, excess carrier may tunnel (or otherwise migrate) from the body regions 18, through the intervening insulative regions 62 and into the extensions 44 to be drained from the body regions. The migration of the excess carrier is diagrammatically illustrated in FIG. 5A with dashed lines 65. The portions 64 have sufficient overlap with the body regions to enable excess carrier to be pumped out of the body regions.

In the shown embodiment, insulative material 66 is provided over the extensions 44. The insulative material 66 may comprise a same composition as the material 60, or a different composition than the material 60. The insulative materials 30, 60 and 66 may comprise a same composition as one another, or at least one of the materials may comprise a different composition relative to at least one other of the materials.

In some embodiments, the extensions 44 of FIGS. 5-5B may provide an added benefit of providing shielding between adjacent digit lines (e.g., between the neighboring digit lines DL1 and DL2, as shown in FIG. 5A).

Figure 6:
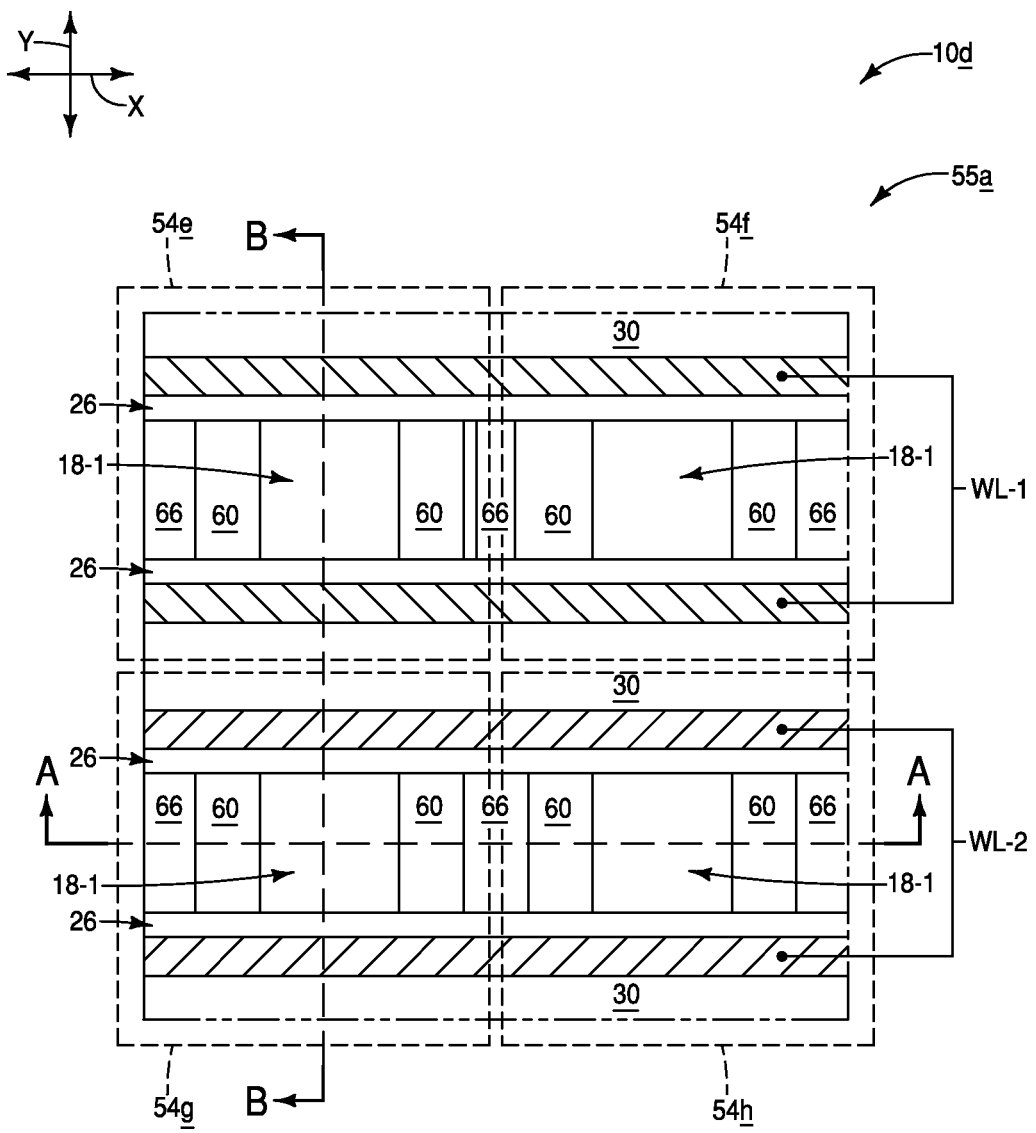
FIGS. 6, 6A and 6B are views of a region of an example integrated assembly comprising example memory cells.
Figure 6A:
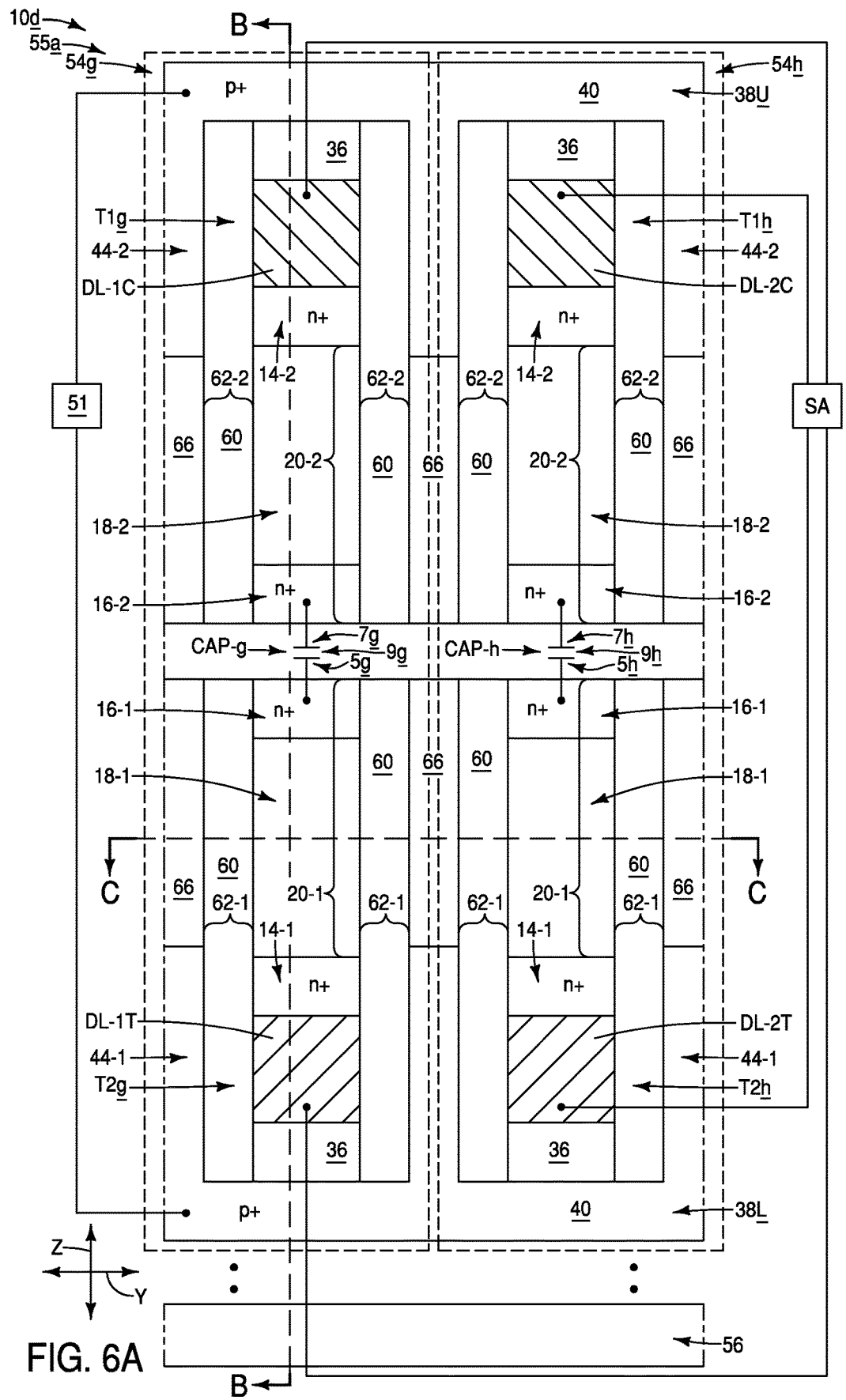
Figure 6B:
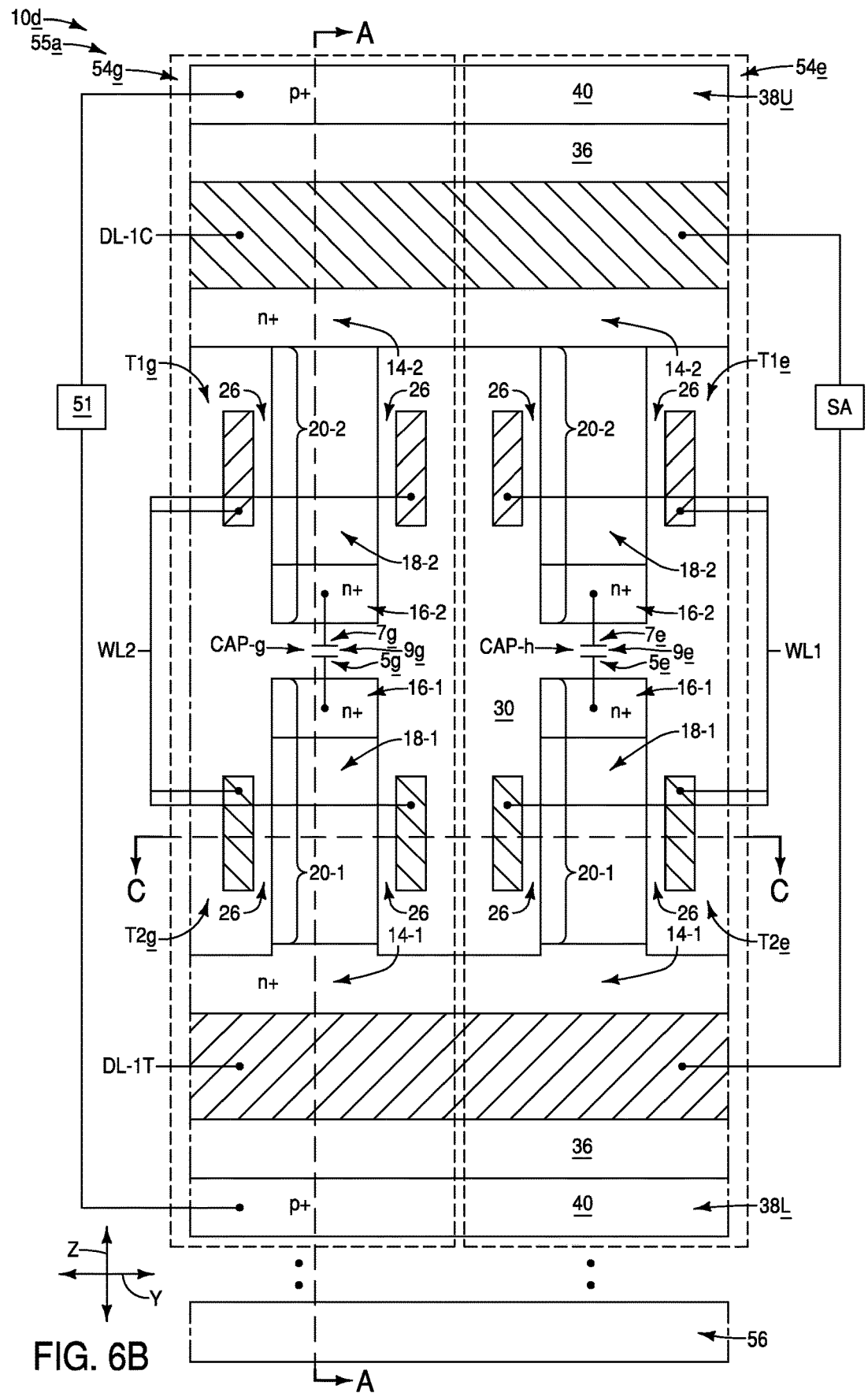

The configuration of FIGS. 5-5B may be modified to be incorporated into 2T-1C memory cells analogous to those described above with reference to FIGS. 4-4B. FIGS. 6-6B show regions of an example integrated assembly (construction) 10d illustrating example 2T-1C memory cells 54e, 54f, 54g and 54h of a memory array 55a. The memory cell 54e comprises first and second transistors T1e and T2e, together with the capacitor CAP-e. Similarly, the memory cell 54f comprises first and second transistors T1f and T2f, together with the capacitor CAP-f (with the first transistor T1f and the capacitor CAP-f not being shown in FIGS. 6-6B); the memory cell 54g comprises first and second transistors T1g and T2g, together with the capacitor CAP-g; and the memory cell 54h comprises first and second transistors T1h and T2h, together with the capacitor CAP-h.

The capacitor CAP-e has first and second nodes 5e and 7e, respectively, and has capacitor dielectric material 9e between the first and second nodes. Similarly, the capacitor CAP-g has first and second nodes 5g and 7g, respectively, and has capacitor dielectric material 9g between the first and second nodes; and the capacitor CAP-h has first and second nodes 5h and 7h, respectively, and has capacitor dielectric material 9h between the first and second nodes. The capacitor CAP-f would be configured similarly, but is not shown in FIGS. 6-6B.

The first and second transistors of each of the memory cells (e.g., the first and second transistors T1g and T2g of the memory cell 54g) may be considered together to comprise, in ascending order, the first source/drain region 14-1, the second source/drain region 16-1, the third source/drain region 16-2, and the fourth source/drain region 14-2. The first and second transistors also together comprise the first transistor body region 18-1 and the second transistor body region 18-2. The first transistor body regions 18-1 and the second source/drain regions 16-1 are within vertically-extending first pillars 20-1; and the second transistor body regions 18-2 and the third source/drain regions 16-2 are within vertically-extending second pillars 20-2. The first and second pillars 20-1 and 20-2 may comprise the semiconductor material 22 (not labeled in FIGS. 6-6B) described above with reference to FIGS. 1-1B. The first and fourth source/drain regions 14-1 and 14-2 may comprise the semiconductor material 24 (not labeled in FIGS. 6-6B) described above with reference to FIGS. 1-1B.

The capacitors (e.g., CAP-c) have the first node (e.g., 5c) coupled with the second source/drain regions 16-1, and have the second node (e.g., 7c) coupled with the third source/drain regions 16-2.

The assembly 10d includes the base 56, and the lower carrier-sink-structure 38L over the base. The first comparative digit lines DL-1T and DL-2T are over the lower carrier-sink-structure 38L, and are spaced from the lower carrier-sink-structure by the insulative material 36. The first source/drain regions 14-1 are coupled with the first comparative digit lines, and in the shown embodiment are directly against the first comparative digit lines.

The second comparative digit lines DL-1C and DL-2C are over the fourth source/drain regions 14-2 and are coupled with the fourth source/drain regions.

The upper carrier-sink-structure 38U is over the second comparative digit lines, and is spaced from the second comparative digit lines by the insulative material 36.

The first extension regions (extensions) 44-1 extend upwardly from the lower carrier-sink-structure 38L to vertically overlap the first transistor body regions 18-1, and the second extension regions 44-2 extend downwardly from the upper carrier-sink-structure 38U to vertically overlap the second transistor body regions 18-2. The first and second extension regions 44-1 and 44-2 may be configured to drain excess carriers from the first and second body regions 18-1 and 18-2 in a manner similar to that described above relative to the extension regions 44 in the embodiment of FIGS. 5-5B. The extension regions 44-1 may be considered to be spaced from the body regions 18-1 by first intervening insulative regions 62-1, and the extension regions 44-2 may be considered to be spaced from the body regions 18-2 by second intervening insulative regions 62-2.

The first wordline WL1 extends along the memory cells 54e and 54f; and the second wordline WL2 extends along the memory cells 54g and 54h. The first wordline WL1 has components adjacent each of the body regions 18-1 and 18-2 of the memory cells gated by such wordline, and similarly the second wordline WL1 has components adjacent each of the body regions 18-1 and 18-2 of the memory cells gated by such wordline. The wordlines are spaced from the body regions by the gate dielectric material 26.

The true and complementary digit lines DL-1T and DL-1C form a first paired set DL-1C/DL-1T, and the true and complementary digit lines DL-2T and DL-2C form a second paired set DL-2C/DL-2T. The digit lines of each of the paired digit line sets (e.g., DL-1T/DL-1C) are electrically coupled with the sense amplifier SA.

Figure 7:
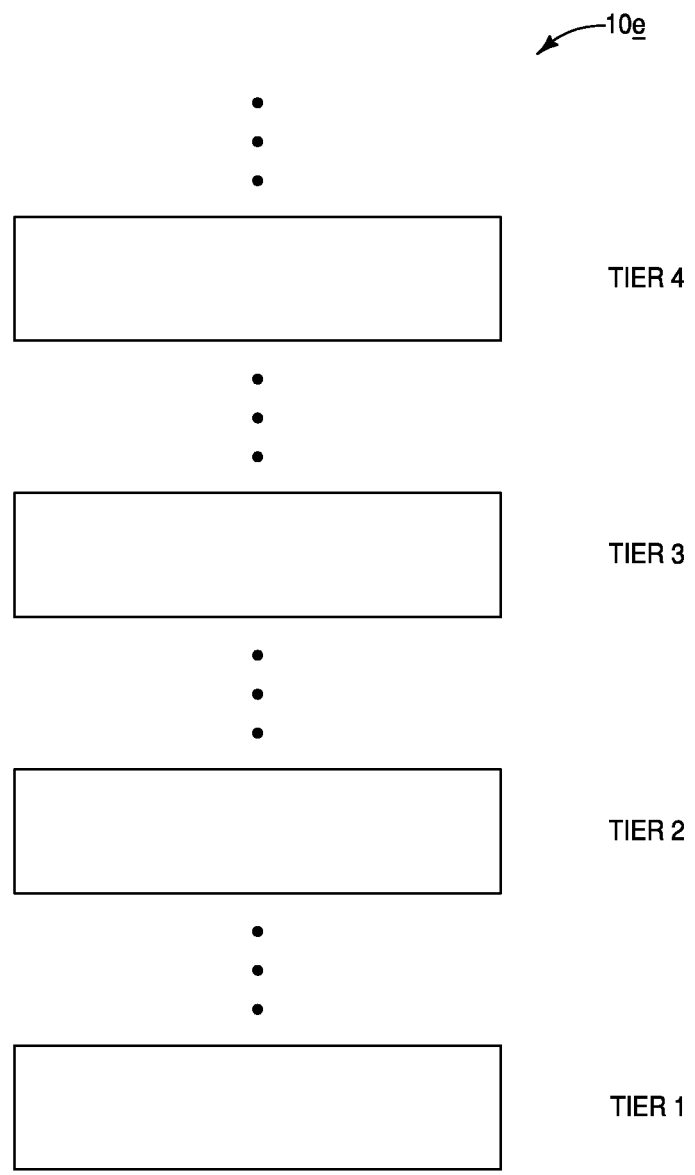
FIG. 7 is a diagrammatic cross-sectional side view of a region of an example assembly comprising stacked tiers.

In some embodiments, the memory arrays of FIGS. 1 and 4-6 may be within a memory tier (i.e., memory deck) which is within a vertically-stacked arrangement of tiers (or decks). For instance, FIG. 7 shows a portion of an integrated assembly 10e comprising a vertically-stacked arrangement of tiers 1-4. The vertically-stacked arrangement may extend upwardly to include additional tiers. The tiers 1-4 may be considered to be examples of levels that are stacked one atop the other. The levels may be within different semiconductor dies (wafers), or at least two of the levels may be within the same semiconductor die. The bottom tier (tier 1) may include control circuitry and/or sensing circuitry (and in some embodiments may include CMOS circuitry). The upper tiers (tiers 2-4) may include memory arrays, such as, for example, the memory arrays of one or more of FIGS. 1 and 4-6. The memory arrays within the various tiers may be the same as one another (e.g., may all be DRAM arrays), or may be different relative to one another. Also, one or more of the upper tiers may include control circuitry or other logic circuitry. The circuitry of one of the tiers may be electrically coupled with the circuitry of another tier vertically offset from said one of the tiers. For instance, circuitry of a memory tire may be coupled with control circuitry of the bottom tier. In some example embodiments, wordlines of a memory tier may be electrically coupled with wordline driver circuitry of the bottom tier. In some example embodiments, bitlines of a memory tier may be electrically coupled with sense-amplifier-circuitry of the bottom tier.

The integrated assemblies of FIGS. 1 and 4-6 may be formed with any suitable processing. FIGS. 8-17 illustrate example processing for forming the assembly of FIGS. 1-1B.

Figure 8:
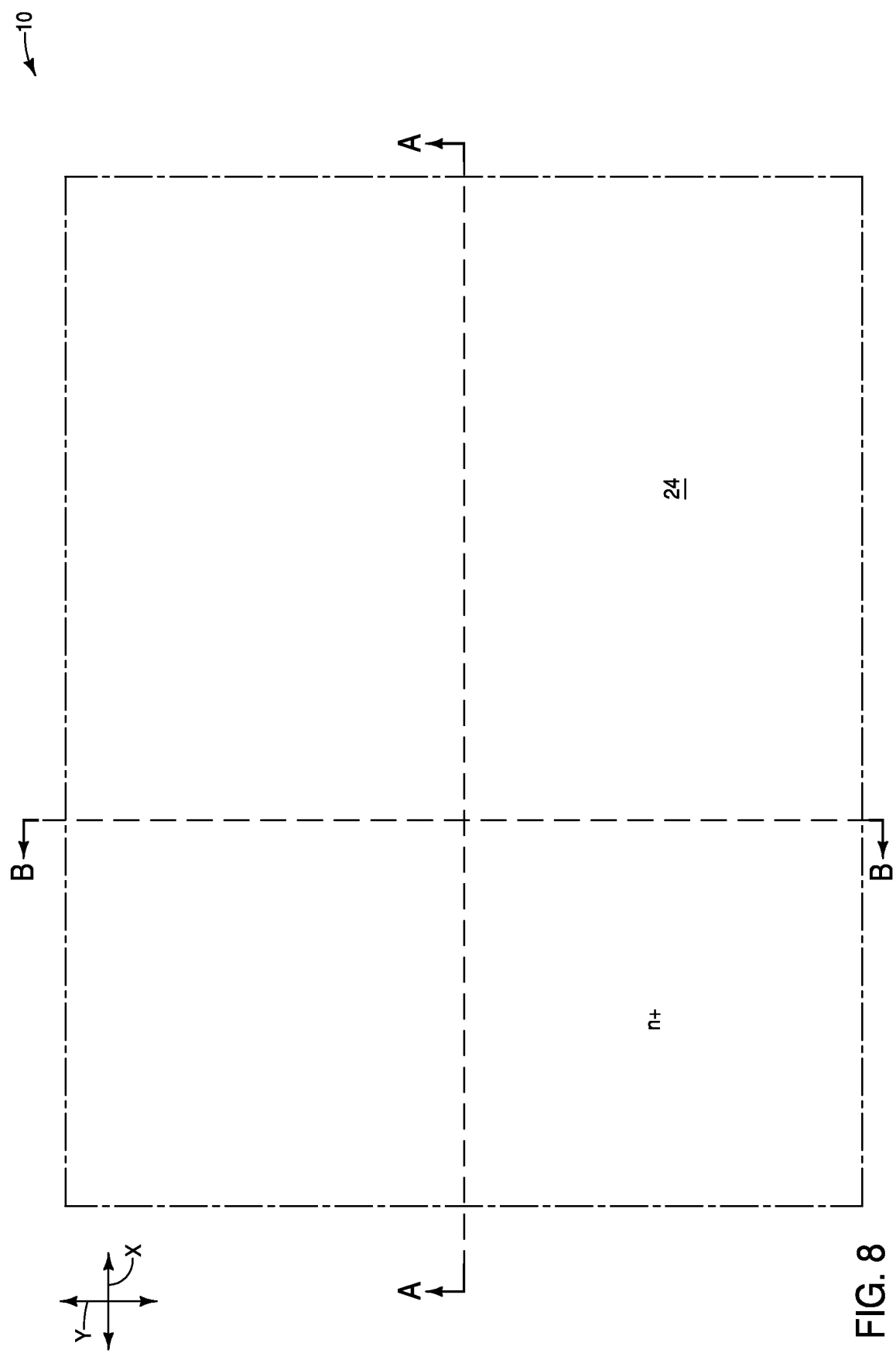
FIGS. 8-17 are diagrammatic top views of an example construction at example process stages of an example method for fabricating an example assembly comprising an example memory array.
Figure 8A:
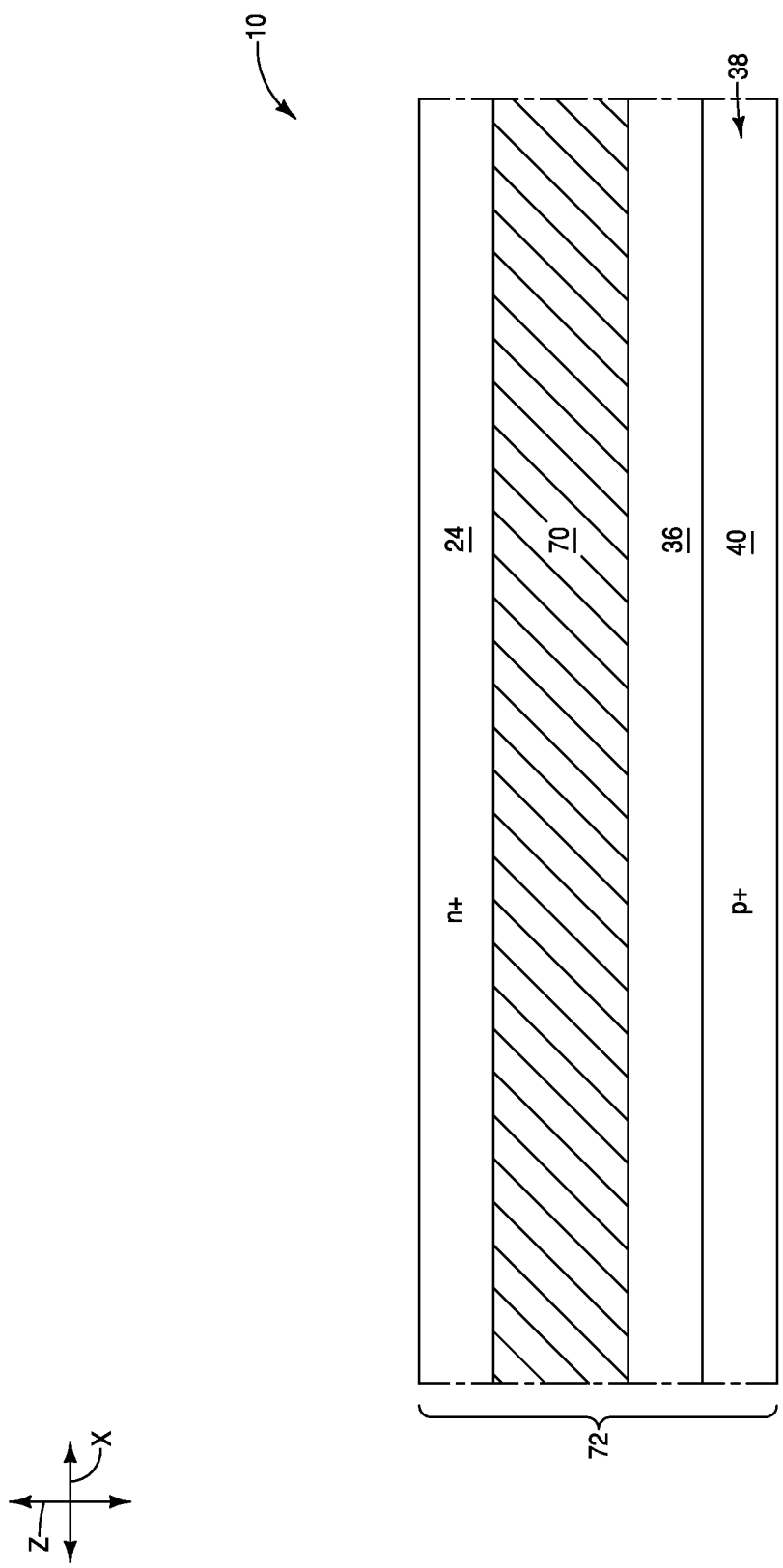
Figure 8B:
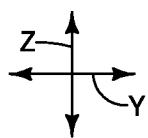
Figure 8B:
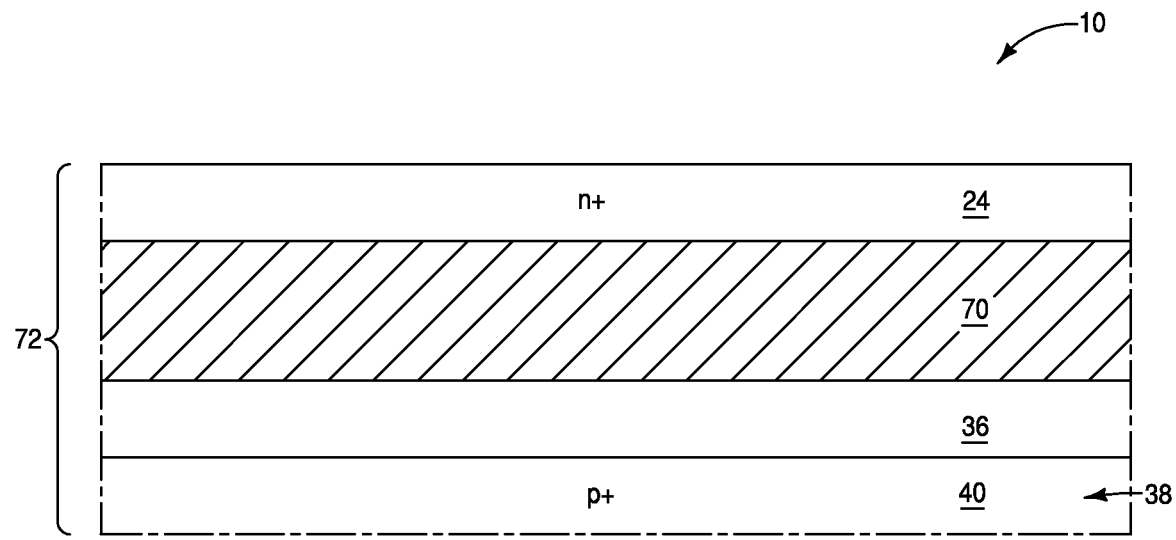

Referring to FIGS. 8-8B, the assembly 10 is shown at an initial process stage. The assembly 10 of FIGS. 8-8B includes the semiconductor material 40 of the carrier-sink-structure 38, the insulative material 36, conductive-digit-line-material 70, and the semiconductor material 24. In some embodiments, the materials 40, 36, 70 and 24 may be considered to be within a stack 72. In some embodiments, such stack may be considered to comprise, in ascending order, a first semiconductor material 40, an insulative material 36, conductive-digit-line-material 70, and a second semiconductor material 24.

The semiconductor materials 40 and 24 are shown to be p-type doped and n-type doped, respectively, to ultimately form a construction of the type described above with reference to FIGS. 1-1B; but it is to be understood that in other embodiments the dopant types of the materials 40 and 24 could be reversed so that material 40 is n-type doped and material 24 is p-type doped. The material 24 is appropriately doped to be utilized in lower source/drain regions 14 (FIGS. 1-1B).

The digit-line-material 70 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit-line-material will comprise metal (e.g., one or more of titanium, titanium nitride, titanium silicide, tungsten, tungsten nitride, tungsten silicide etc.), and will be referred to as a metal-containing-digit-line-material.

The carrier-sink-structure 38 is not shown coupled to the device 51 (described above with reference to FIGS. 1-1B) at the processing stage of FIGS. 8-8B. Such coupling may be present at the processing stage of FIGS. 8-8B in some embodiments, and may be provided at a later processing stage in other embodiments.

The base 56 described above with reference to FIGS. 1-1B is not shown at the processing stage of FIGS. 8-8B in order to simplify the drawings, but it is to be understood that such base may be present.

Figure 9:
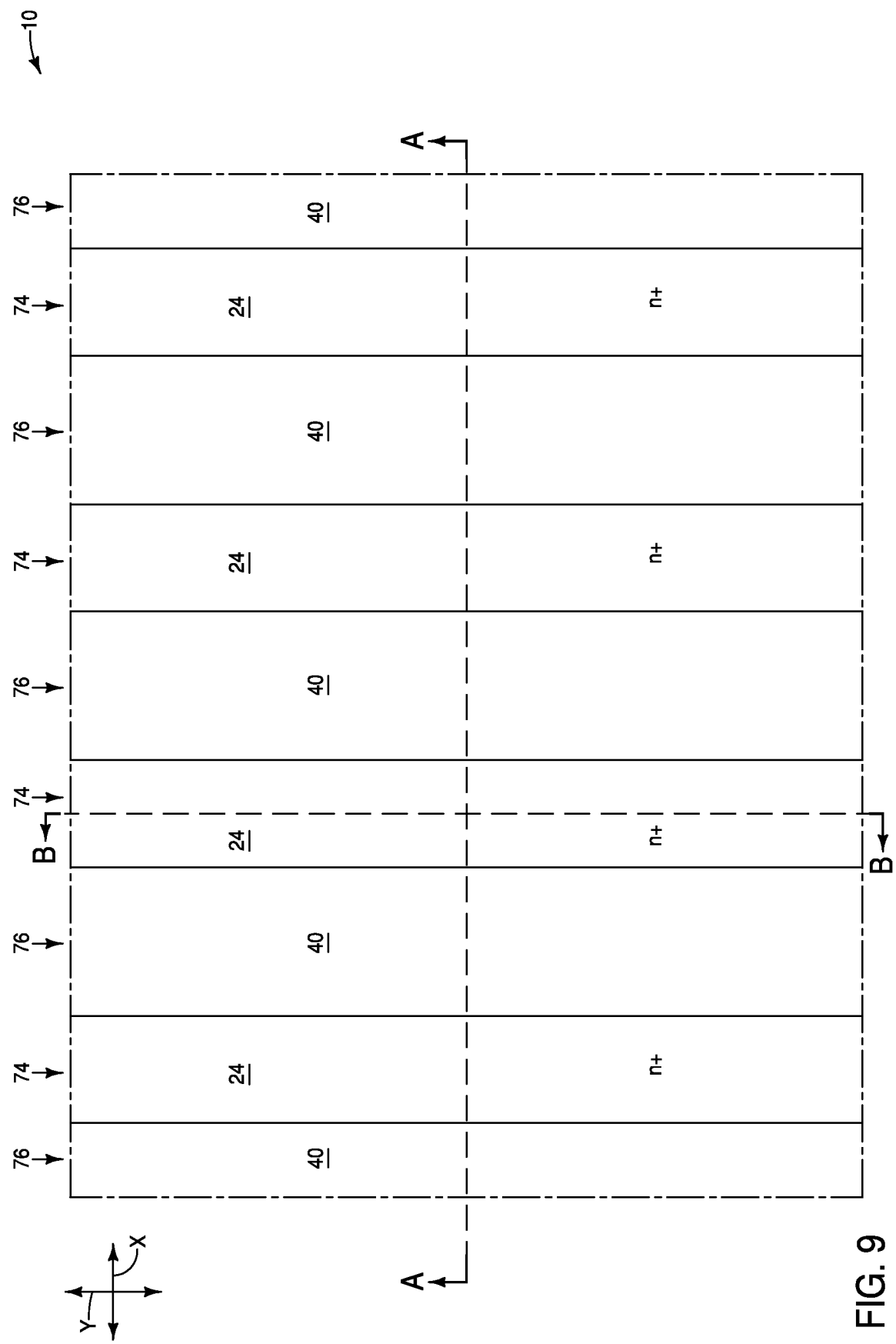
Figure 9A:
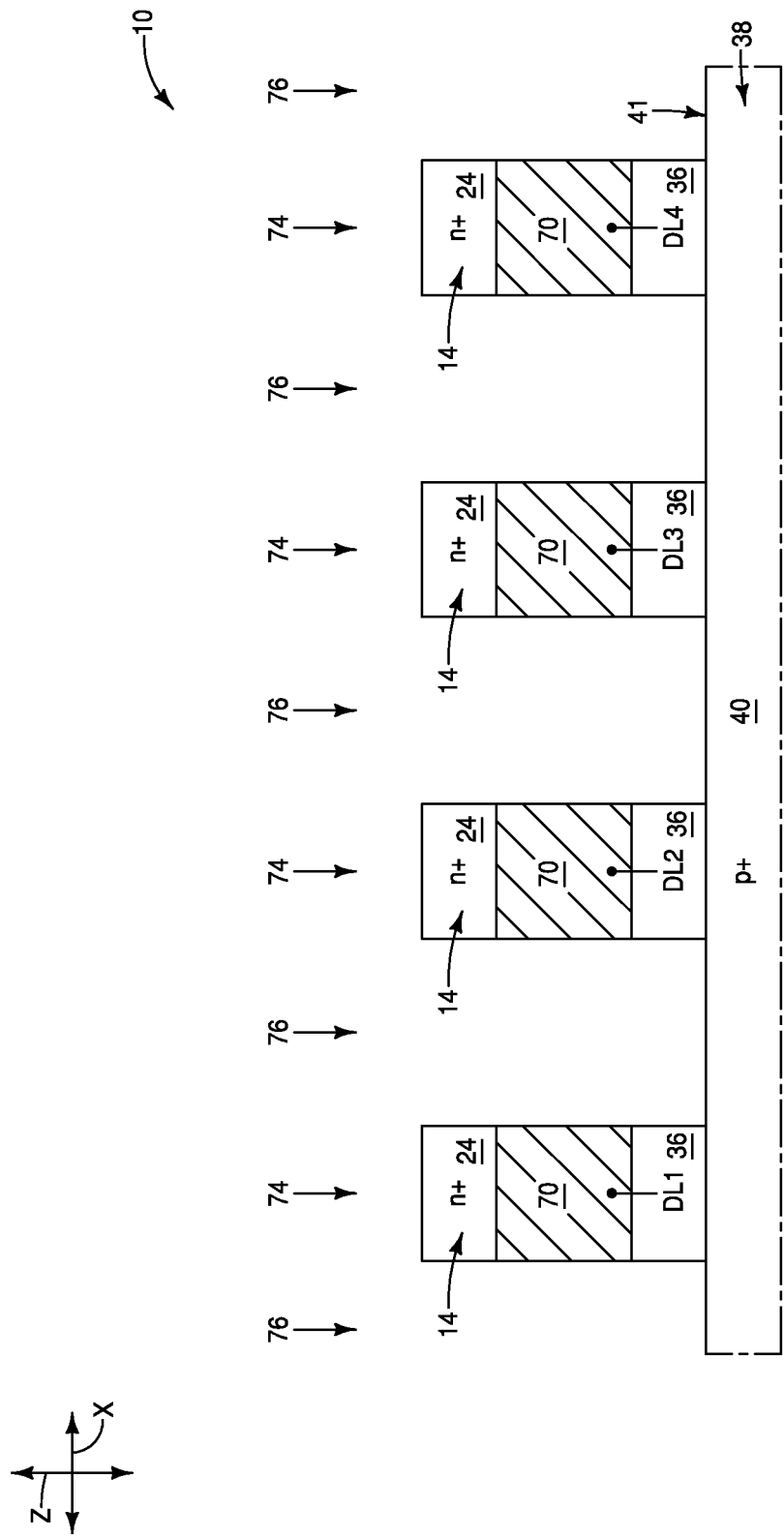
Figure 9B:
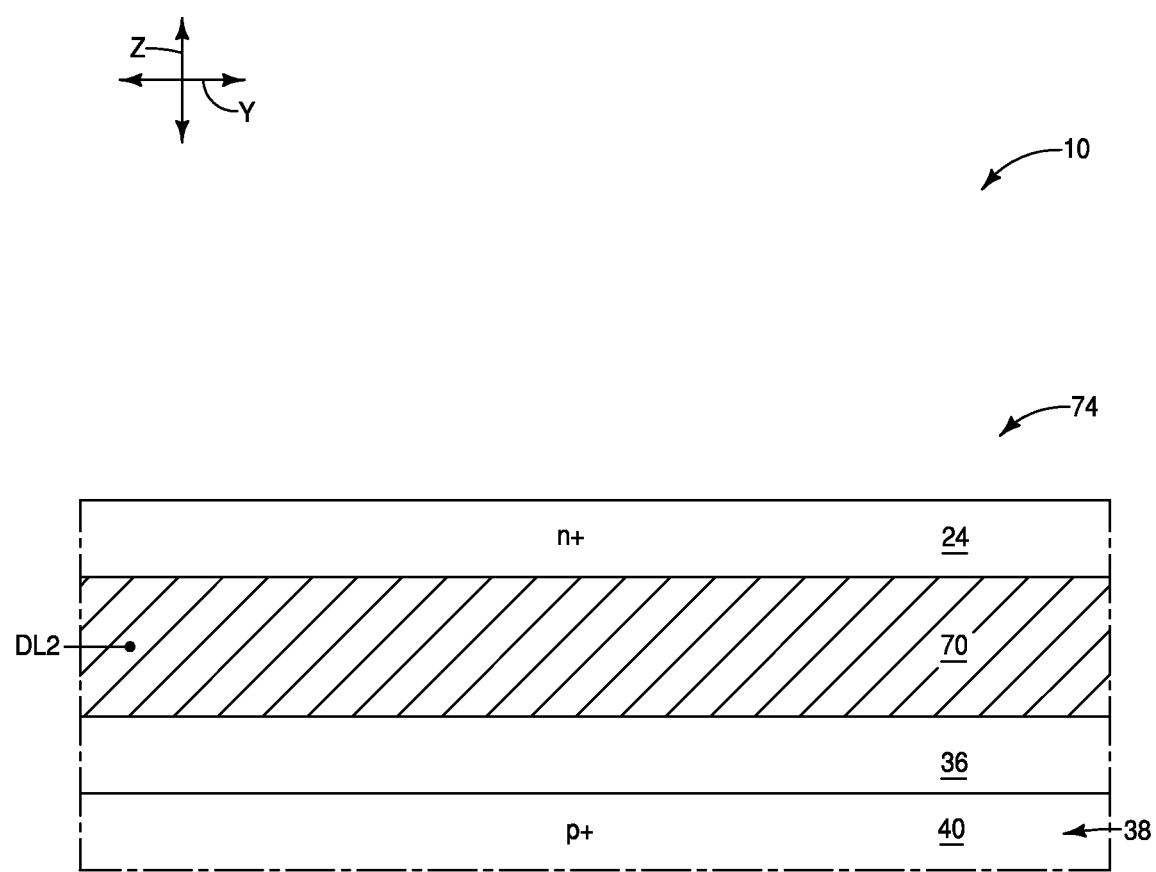

Referring to FIGS. 9-9B, the materials 36, 70 and 24 are patterned into rails 74 extending along the direction of the y-axis. The materials may be patterned utilizing any suitable methodology. For instance, a mask (not shown) may be provided over construction 10 to define locations of the rails, then one or more suitable etches may be utilized to pattern the rails, and finally the mask may be removed to leave the illustrated construction of FIGS. 9-9B. In some embodiments, at least a portion of the mask may remain at the processing stage of FIGS. 9-9B to protect an upper surface of the semiconductor material 24 during subsequent process stages.

The rails 74 are spaced from one another by gaps 76. The gaps 76 extend to an upper surface 41 of the semiconductor material 40, and expose such upper surface. In some embodiments, the exposed upper surface of material 40 may be considered to be along bottom peripheries of the gaps 76.

The formation of rails 74 patterns the digit-line-material 70 into the digit lines DL1, DL2, DL3 and DL4; and patterns the semiconductor material 24 into the lower source/drain regions 14.

Figure 10:
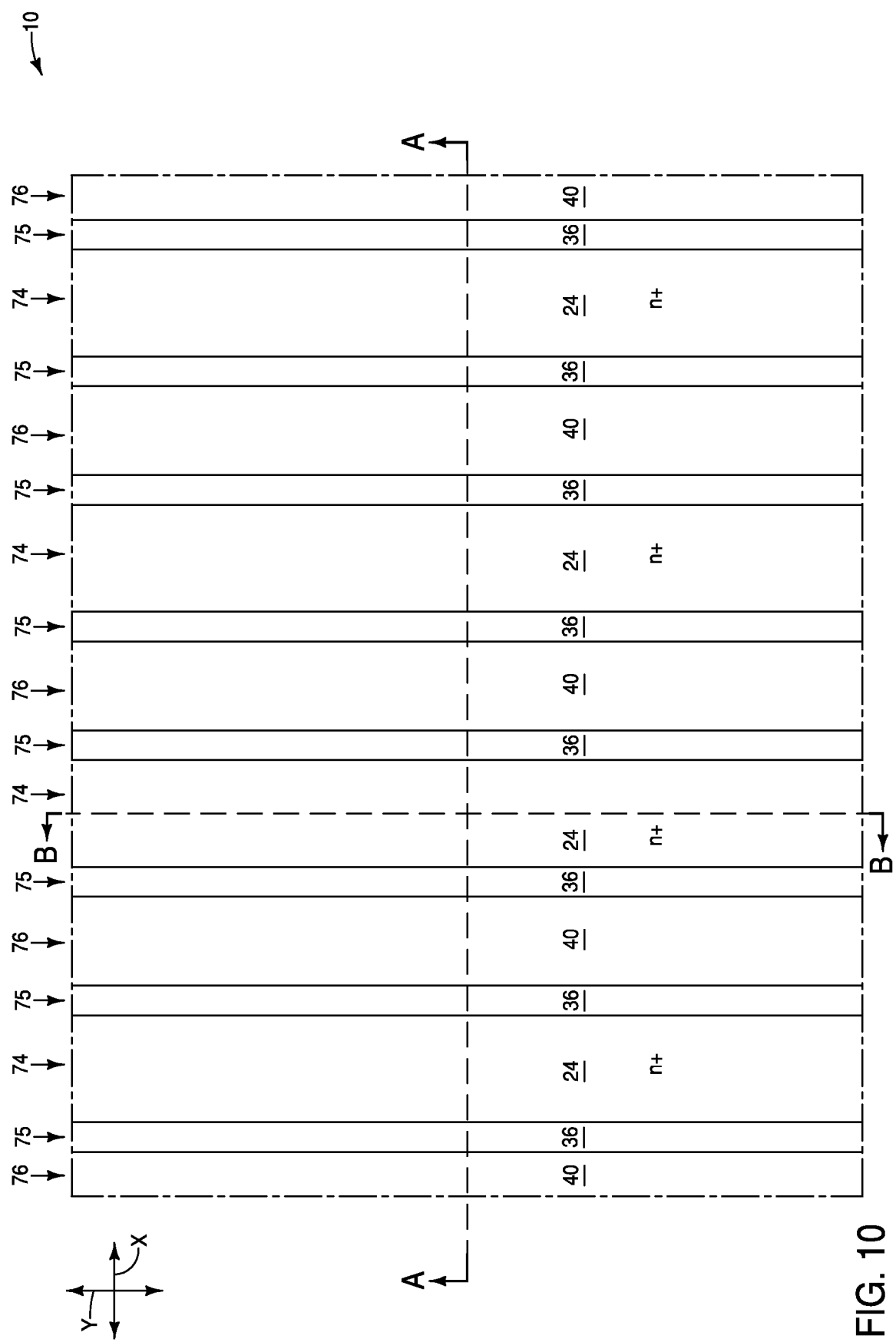
Figure 10A:
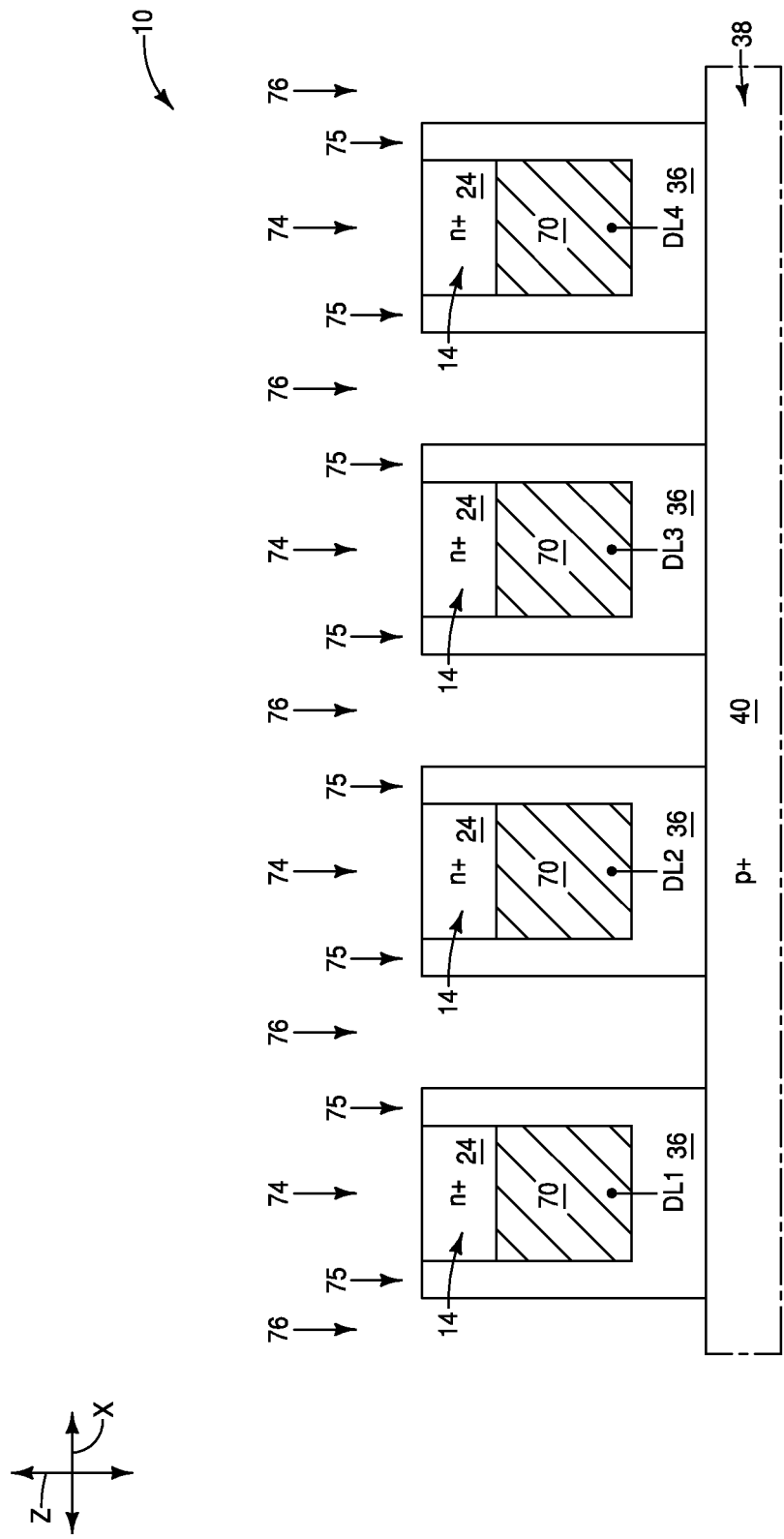
Figure 10B:
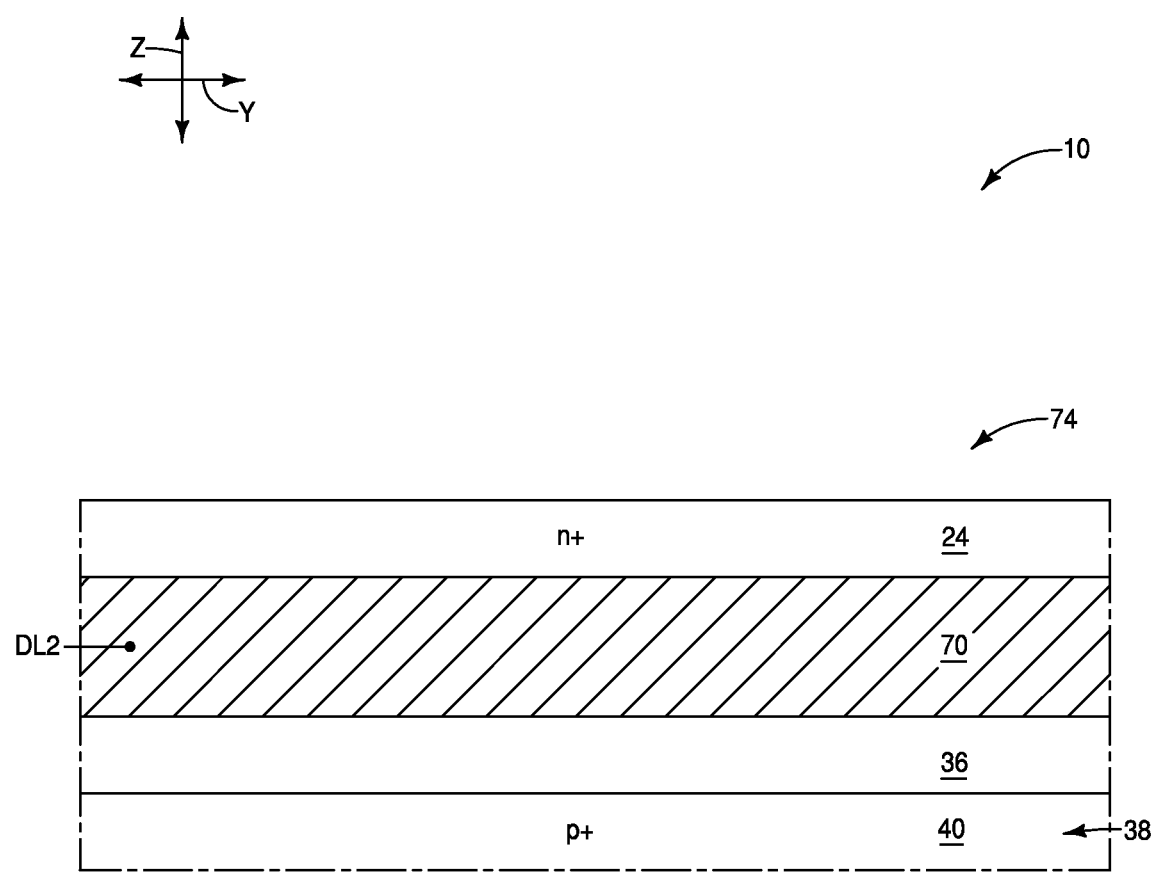

Referring to FIGS. 10-10B, insulative spacers 75 are formed along sidewalls of the rails 70. The insulative spacers comprise the insulative material 36. In some embodiments, the insulative spacers 75 may be referred to as first insulative spacers to distinguish them from other insulative spacers which are formed in subsequent process steps.

The insulative spacers 75 may be formed with any suitable processing. For instance, a layer of the material 36 may be provided to extend over the rails 74, along the sidewalls of the rails, and across the gaps 76; and then such layer may be anisotropically etched to form the spacers 75.

Figure 11:
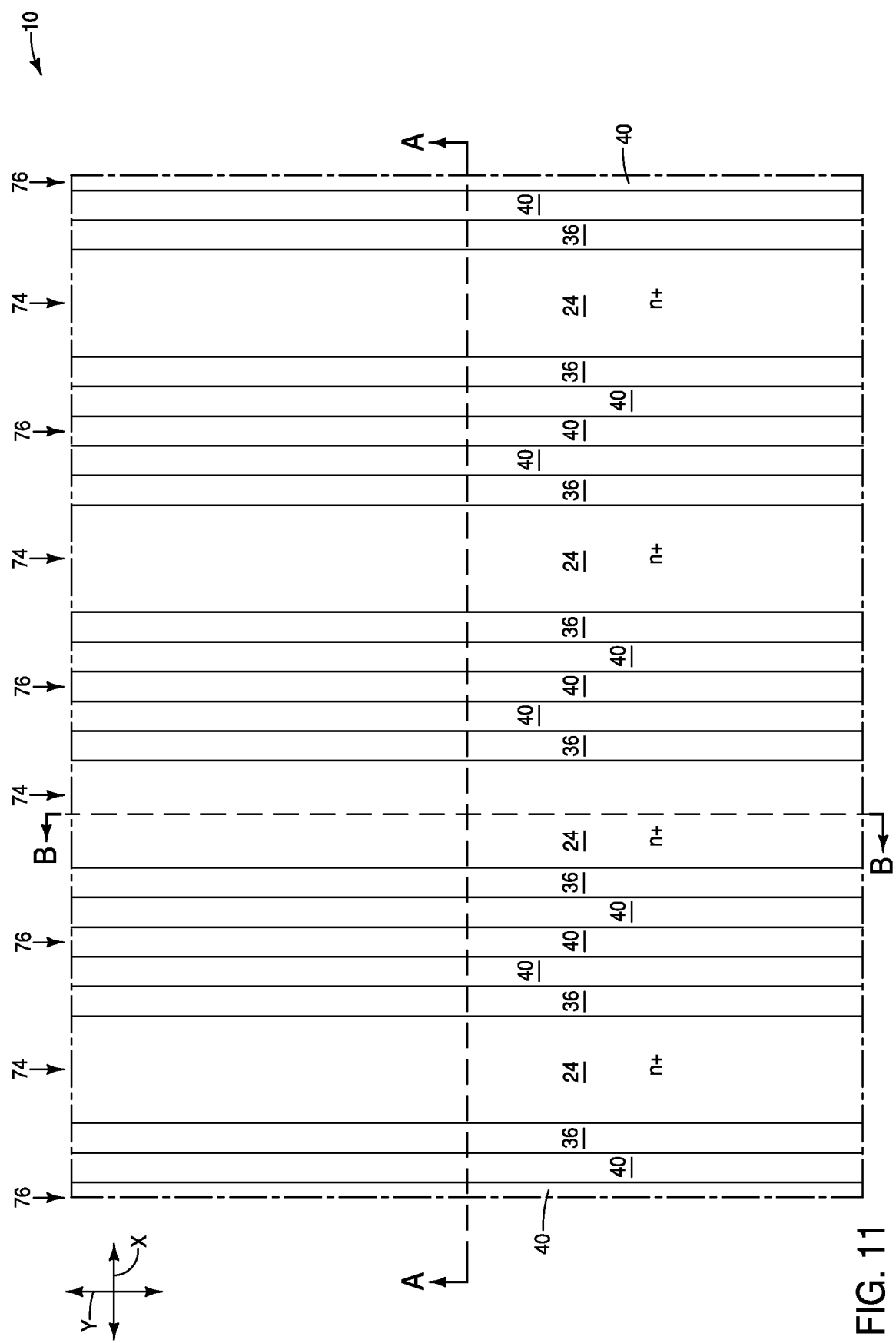
Figure 11A:
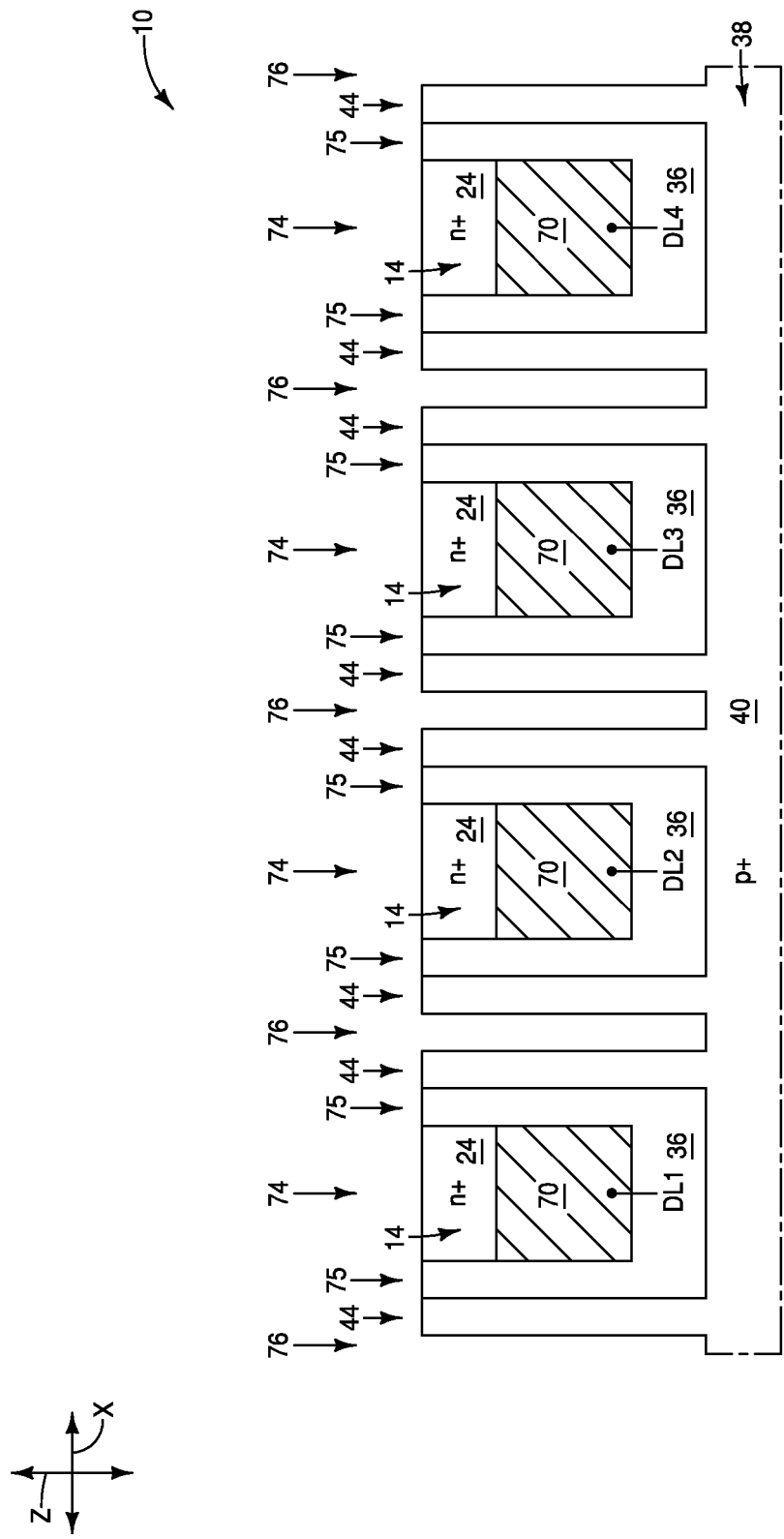
Figure 11B:
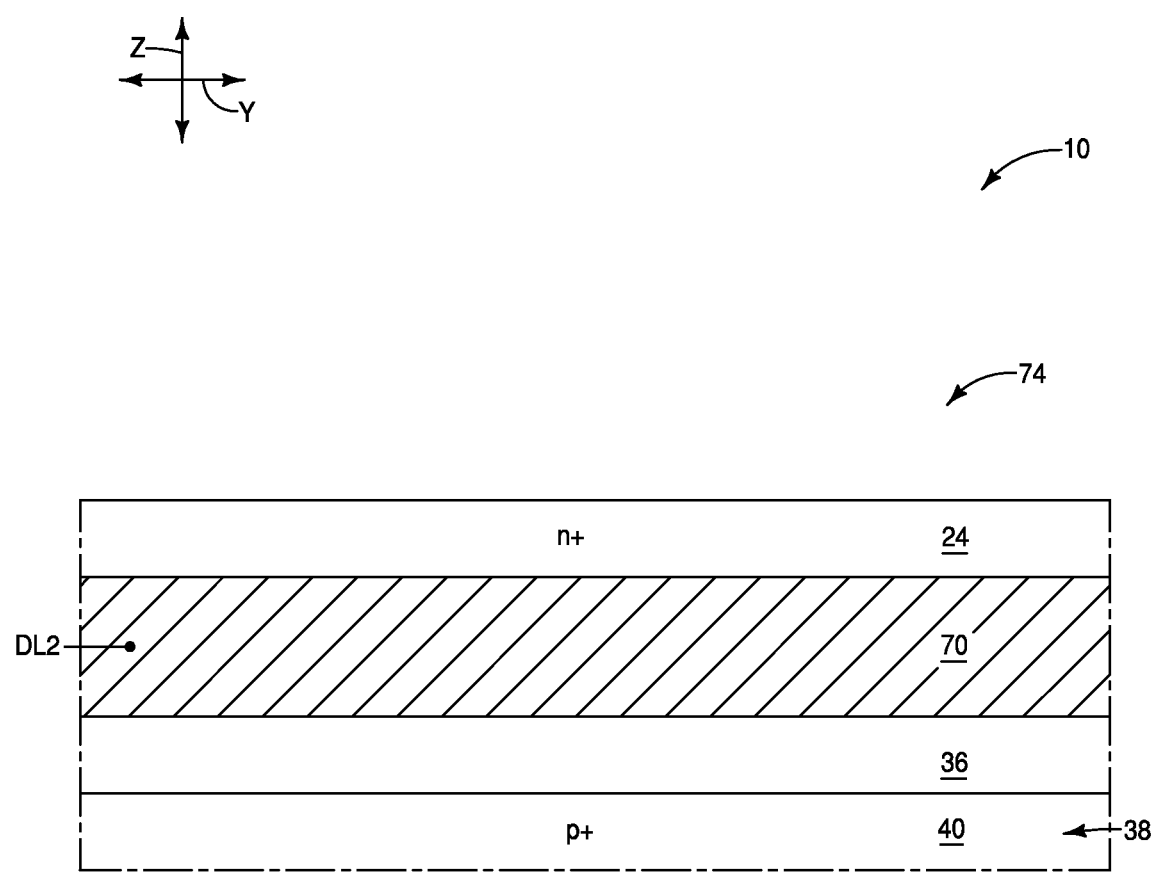

Referring to FIGS. 11-11B, semiconductor extensions 44 (i.e., extension regions) are formed along the insulative spacers 75. The semiconductor extensions 44 comprise the semiconductor material 40.

The semiconductor extensions 44 may be formed with any suitable processing. For instance, a layer of the semiconductor material 40 may be provided to extend over the rails 74, along sidewalls of the spacers 75, and across the gaps 76; and then such layer may be anisotropically etched to form the illustrated semiconductor extensions 44.

The semiconductor extensions 44 may be doped to any suitable dopant type and concentration; with example dopant types and concentrations being discussed above with reference to FIGS. 1-1B.

The semiconductor extensions 44 and spacers 75 narrow the gaps 76.

Figure 12:
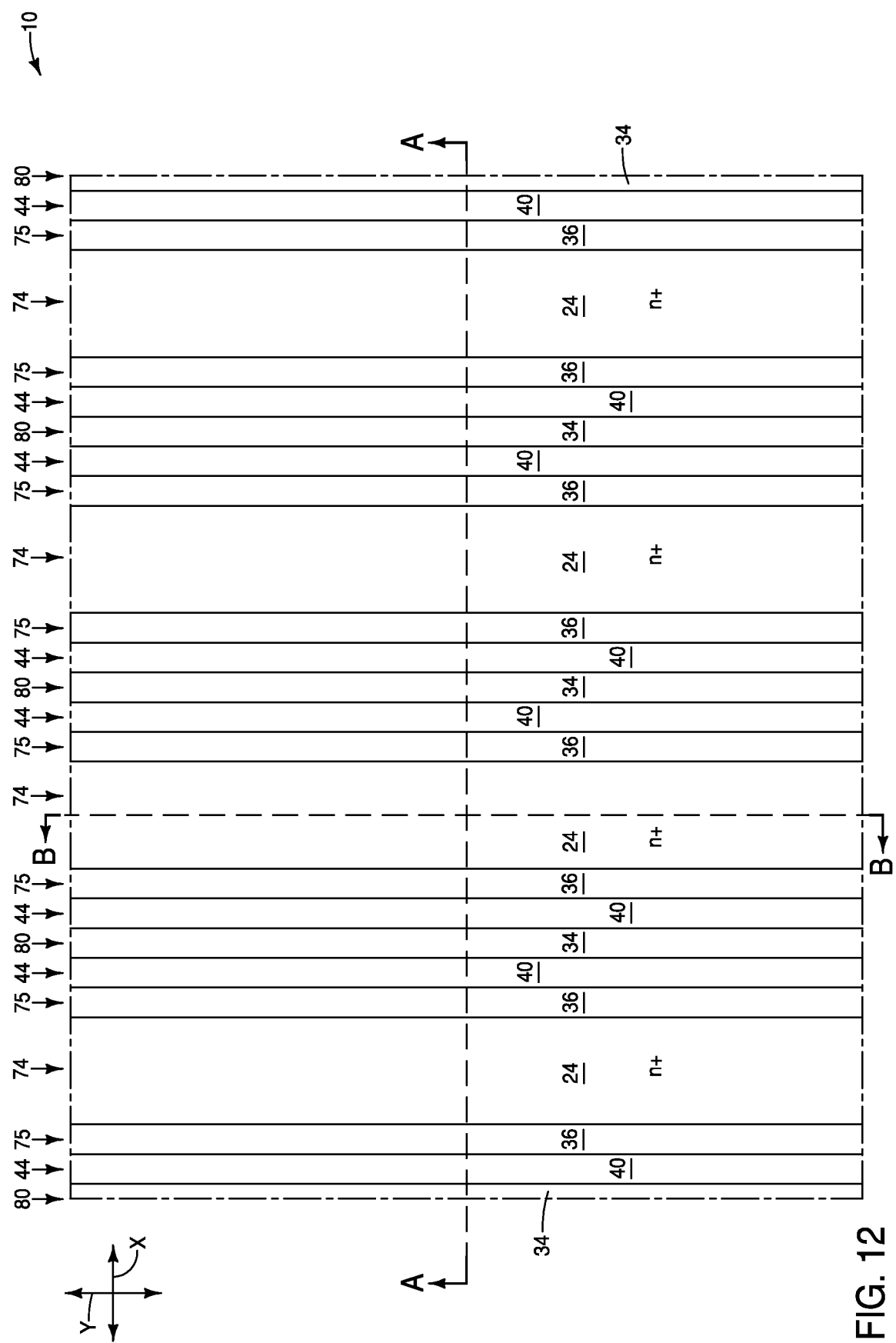
Figure 12A:
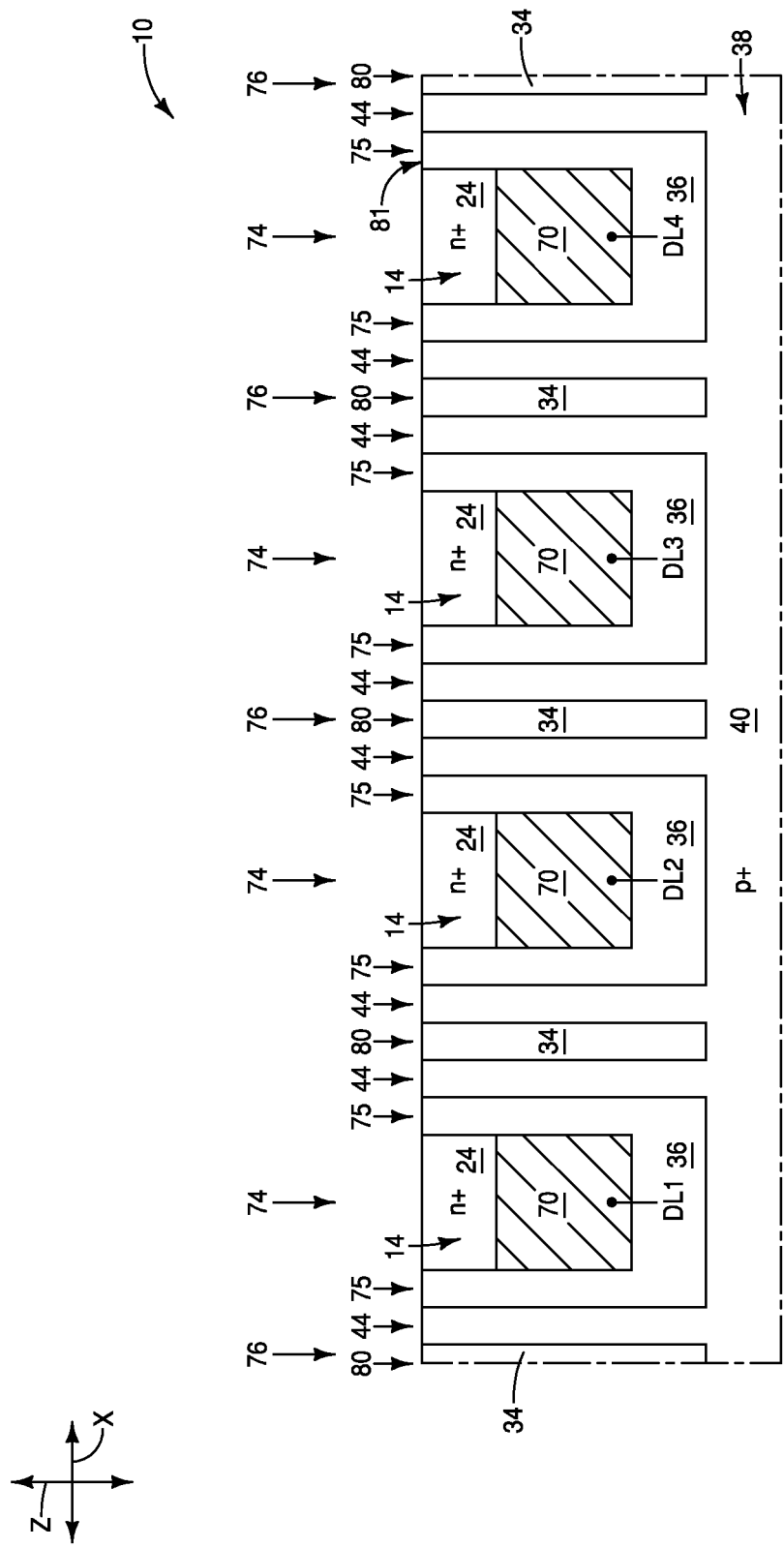
Figure 12B:
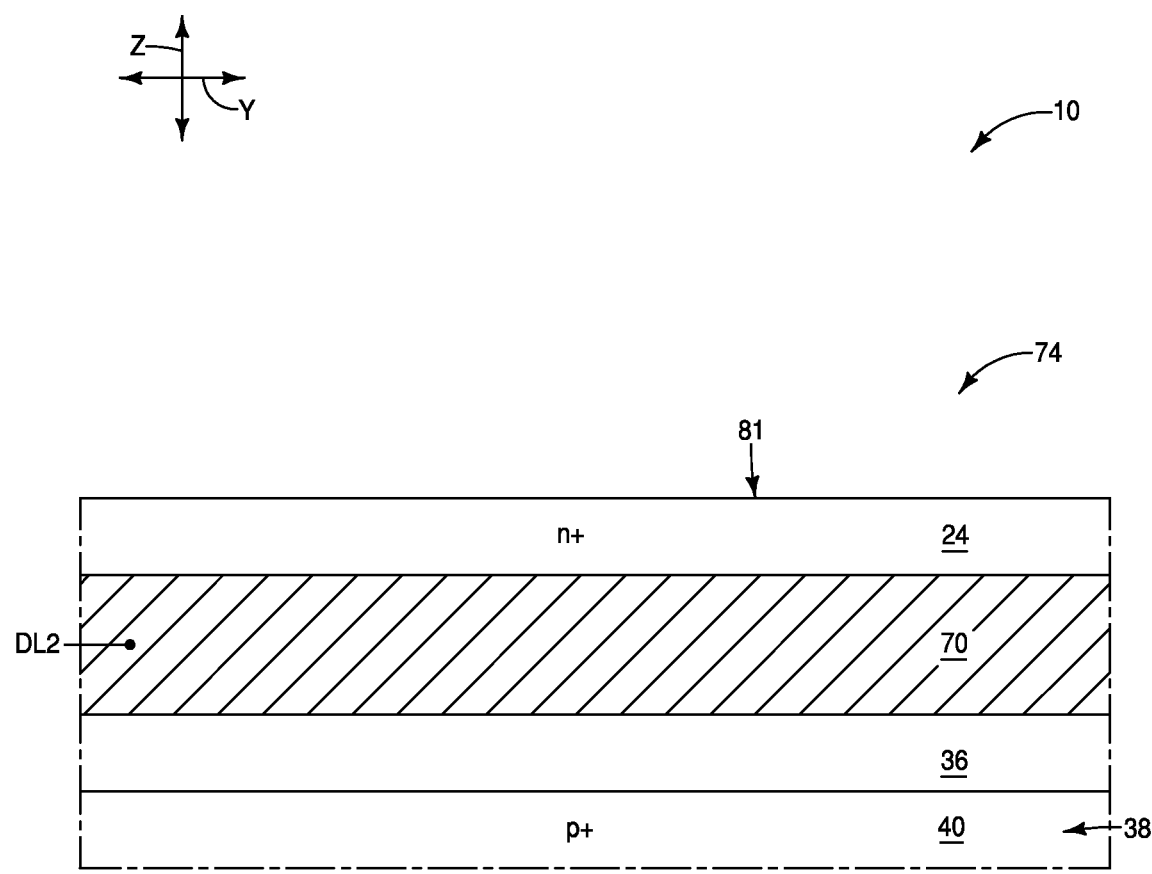

Referring to FIGS. 12-12B, insulative spacers 80 are formed within the narrowed gaps 76 (such narrowed gaps are shown in FIG. 11A). The insulative spacers 80 may be referred to as second spacers to distinguish them from the first insulative spacers 75.

The insulative spacers 80 comprise the insulative material 34.

A planarized surface 81 is formed to extend across the rails 74, the first insulative spacers 75, the semiconductor extensions 44 and the second insulative spacers 80. The planarized surface 81 may be formed utilizing any suitable processing; and in some embodiments may be formed utilizing chemical-mechanical polishing (CMP).

Figure 13:
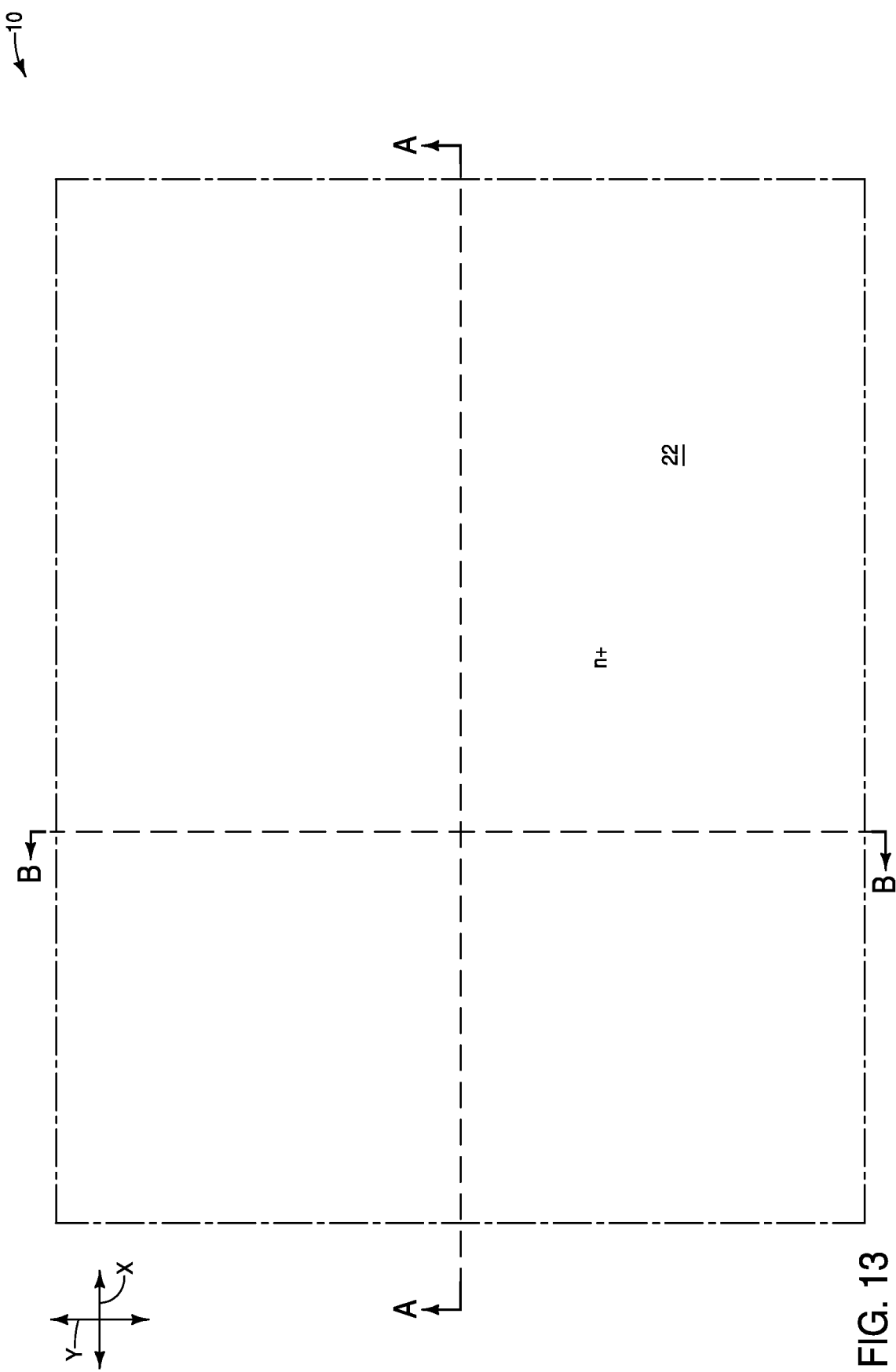
Figure 13A:
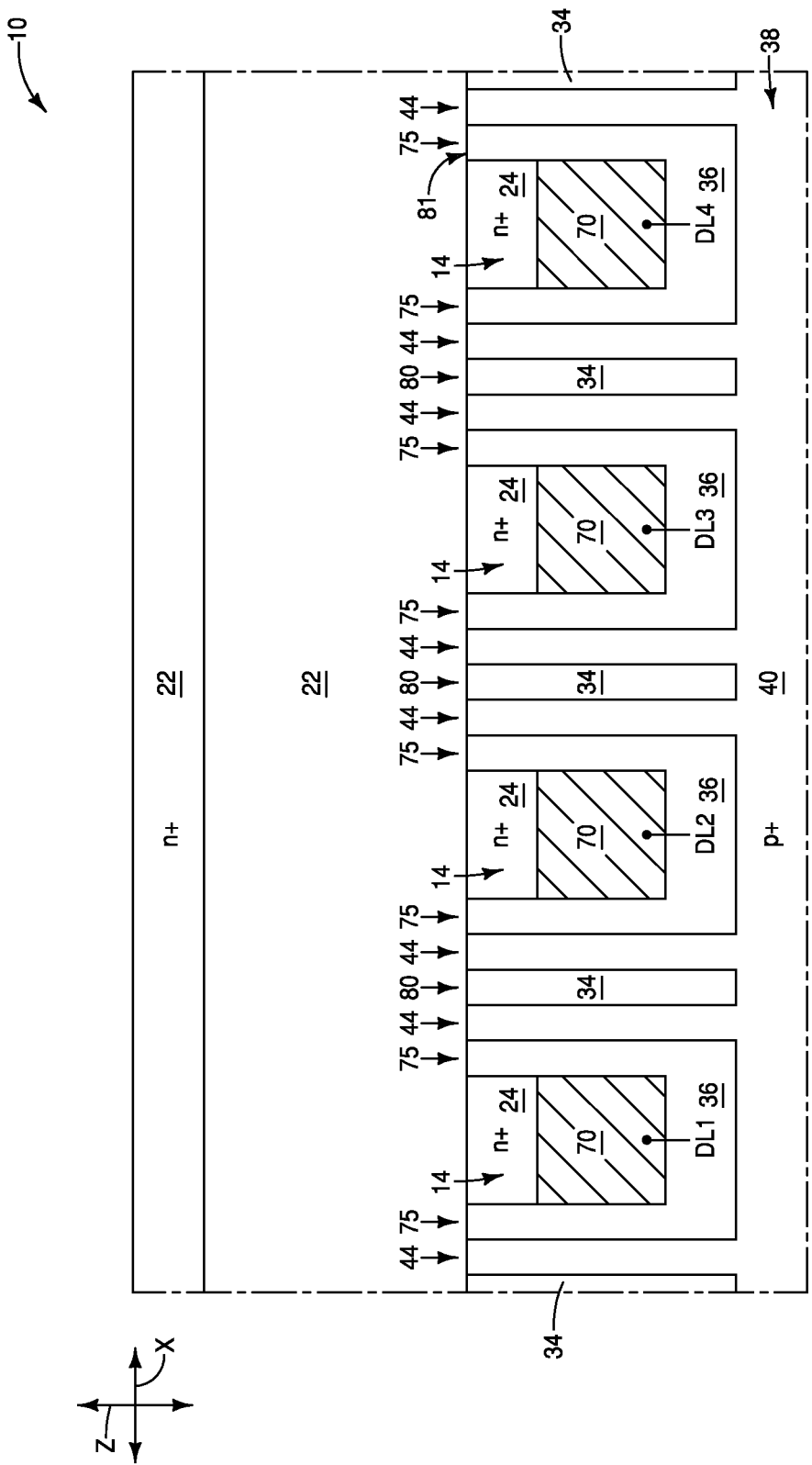
Figure 13B:
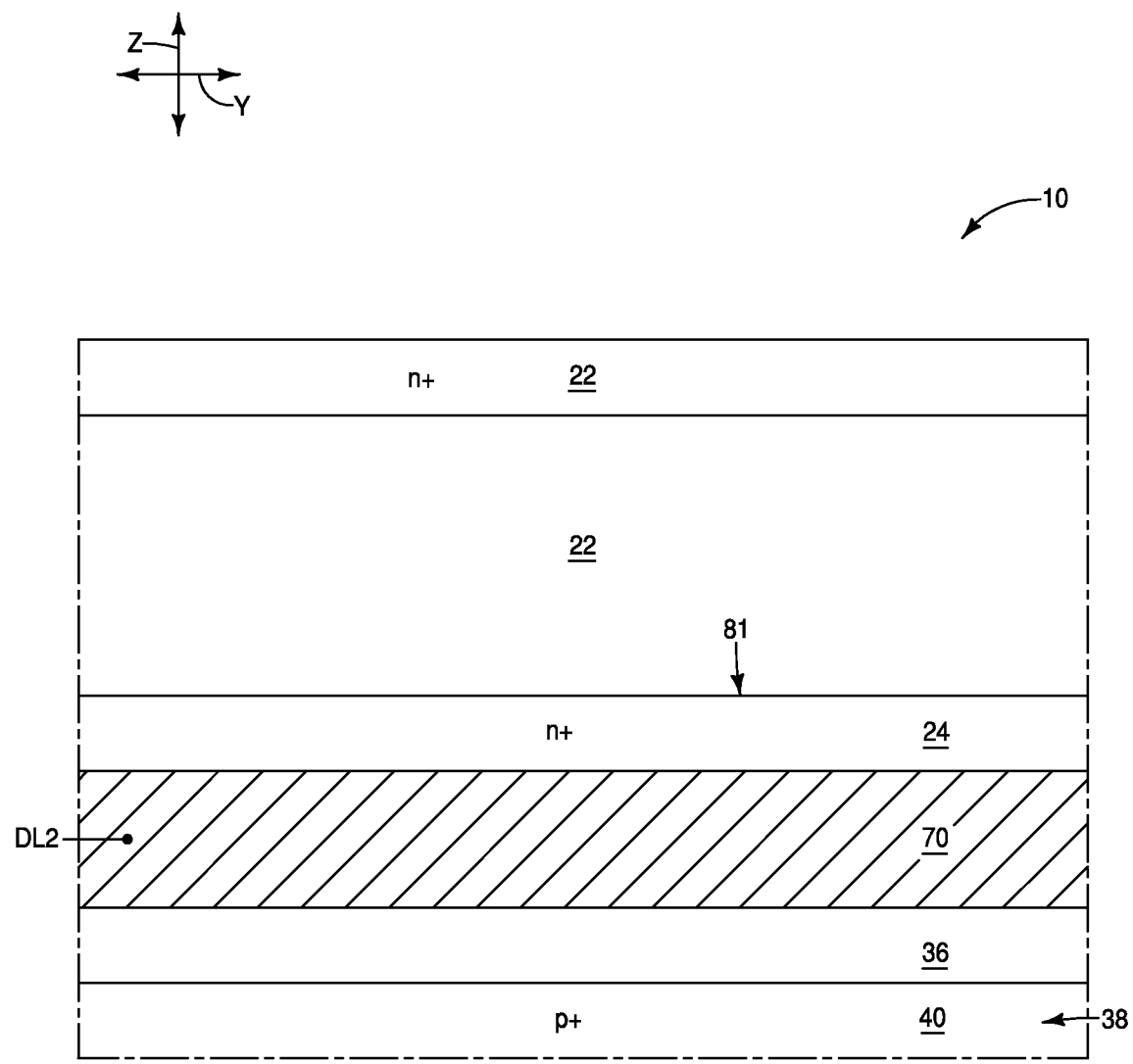

Referring to FIGS. 13-13B, the semiconductor material 22 is formed over and directly against the planarized surface 81. The semiconductor material 22 may comprise the same composition(s) described above with reference to FIGS. 1-1B. In some embodiments, the semiconductor material 22 may be referred to as third semiconductor material to distinguish it from the first semiconductor material 40 and the second semiconductor material 24. In some embodiments, the first, second and third semiconductor materials may all comprise a same composition as one another. For instance, the first, second and third semiconductor materials may all comprise silicon. In other embodiments, at least one of the first, second and third semiconductor materials may comprise a different composition relative to another of the first, second and third semiconductor materials (e.g., one may comprise silicon while another comprises germanium or semiconductor oxide).

In the illustrated embodiment, an upper region of semiconductor material 22 is doped with dopant of the upper source/drain regions 16; with such upper source/drain regions being discussed above with reference to FIGS. 1-1B. The dopant within the upper source/drain regions 16 is shown to be n-type dopant, but in other embodiments may be p-type dopant.

Figure 14:
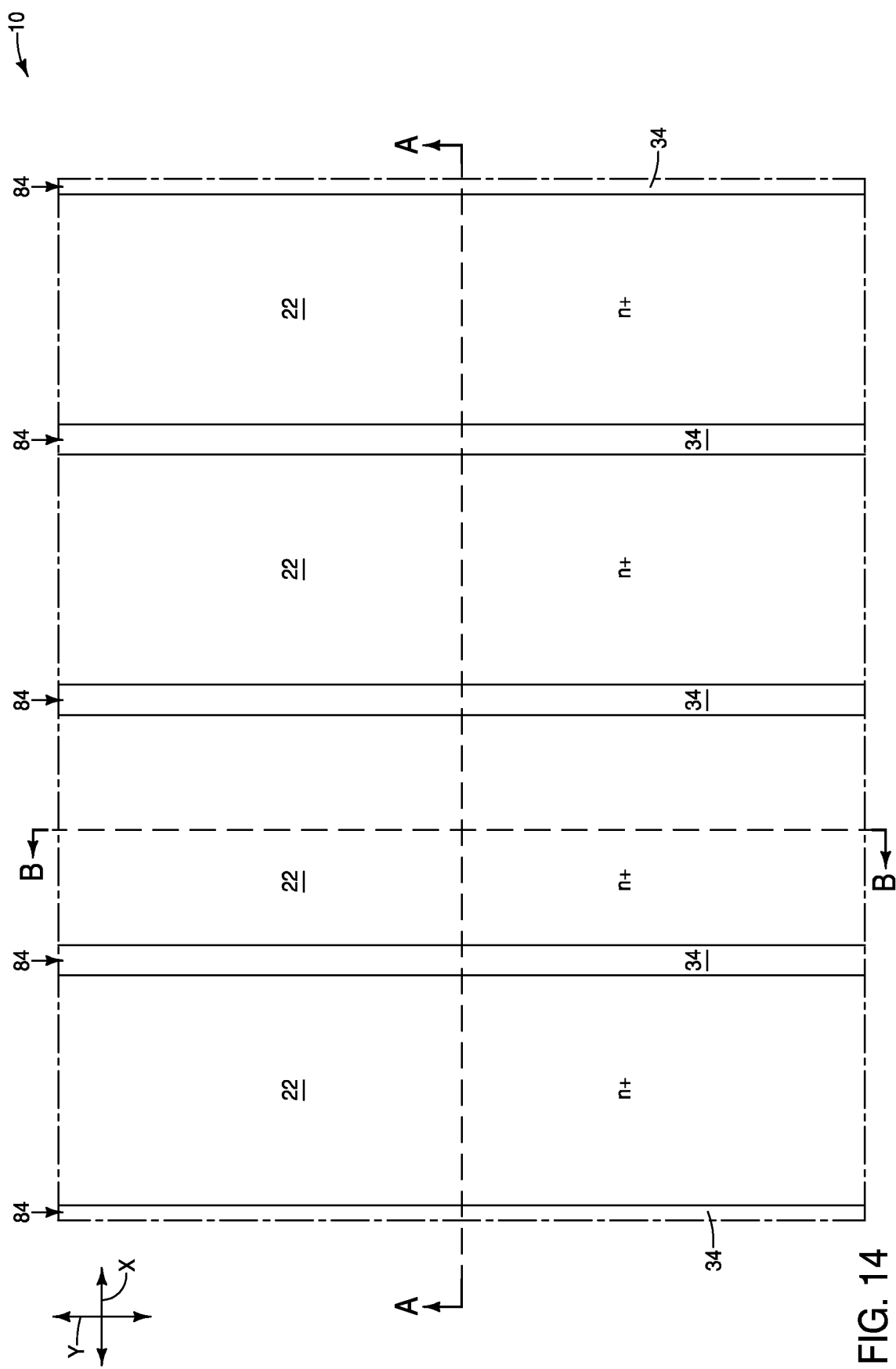
Figure 14A:
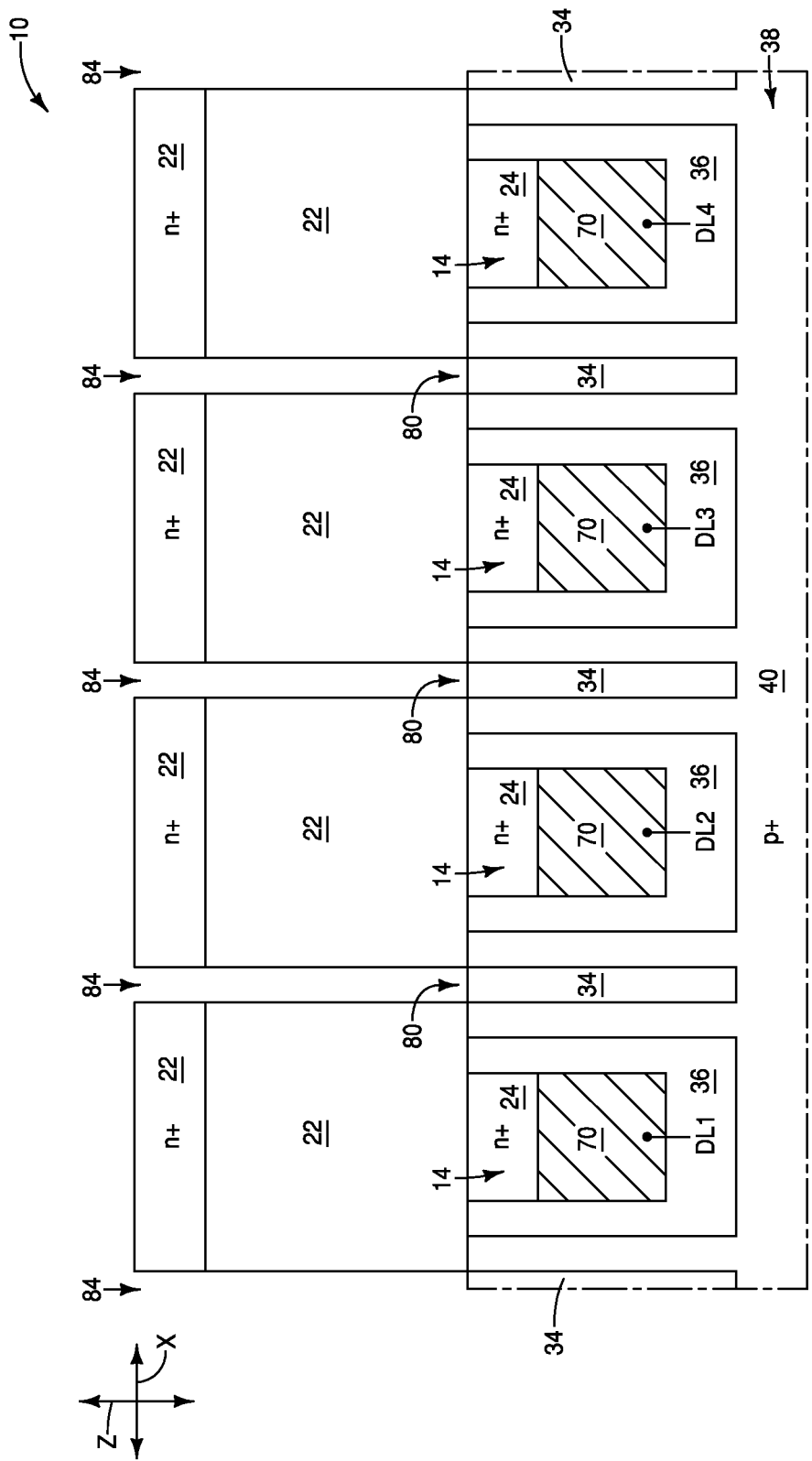
Figure 14B:
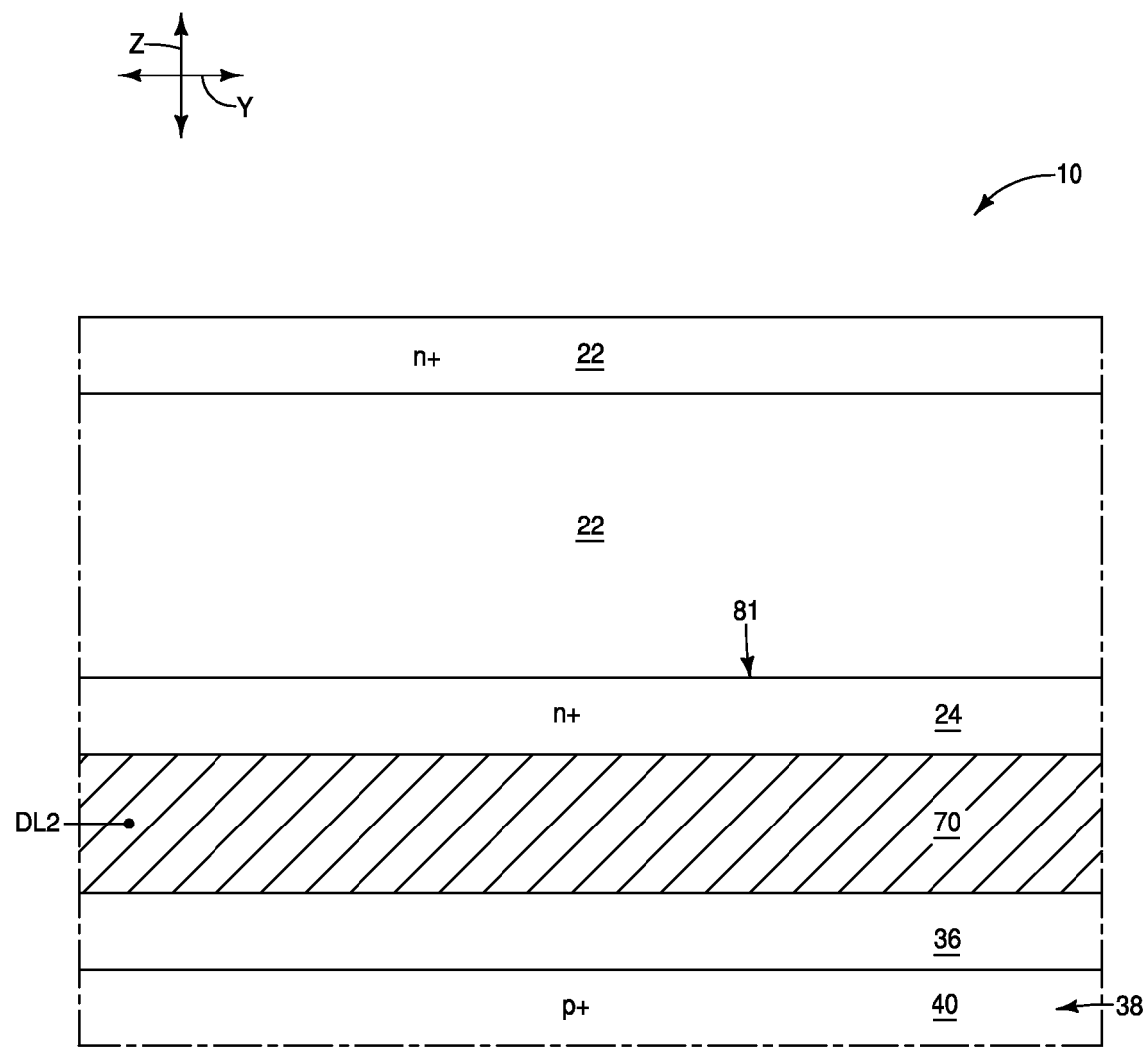

Referring to FIGS. 14-14B, slits 84 are formed to extend through the third semiconductor material 22 to the insulative spacers 80. The slits extend linearly along the direction of the y-axis.

The slits 84 may be formed with any suitable processing. For instance, a patterned mask (not shown) may be provided over construction 10 to define locations of the slits, then the slits may be etched through material 22 with a suitable etch, and subsequently the mask may be removed to leave the illustrated construction of FIGS. 14-14B.

Figure 15:
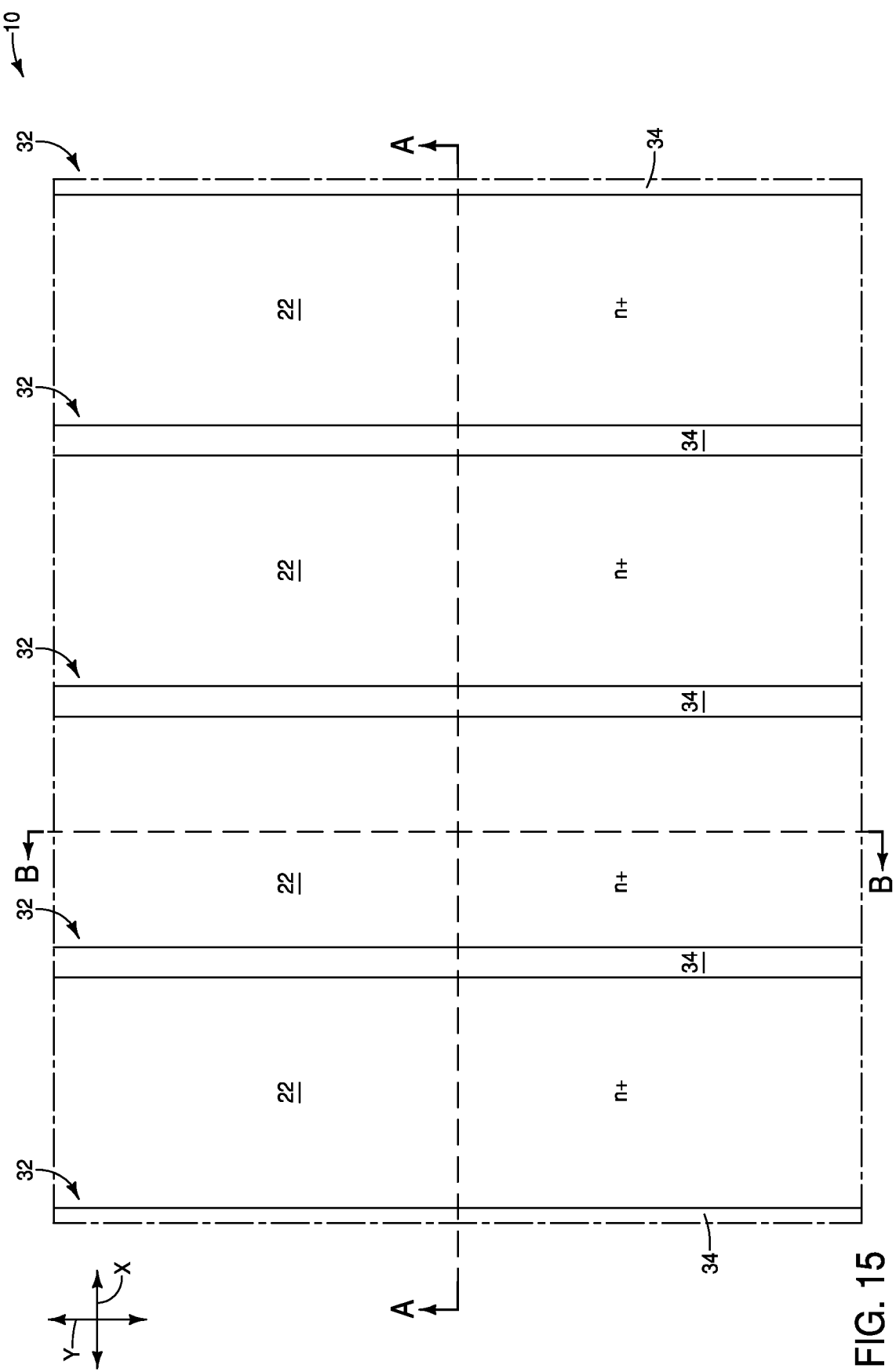
Figure 15A:
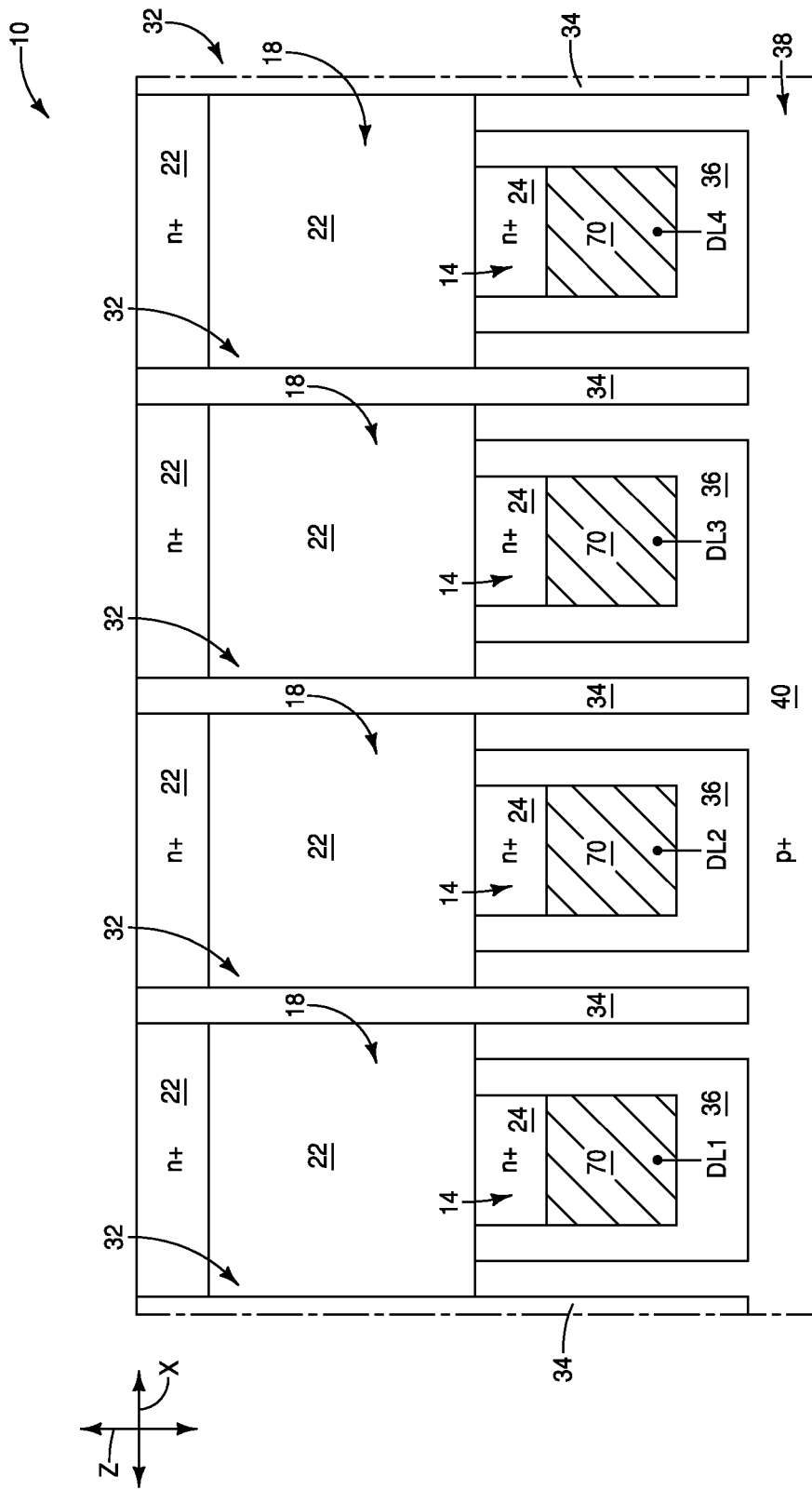
Figure 15B:
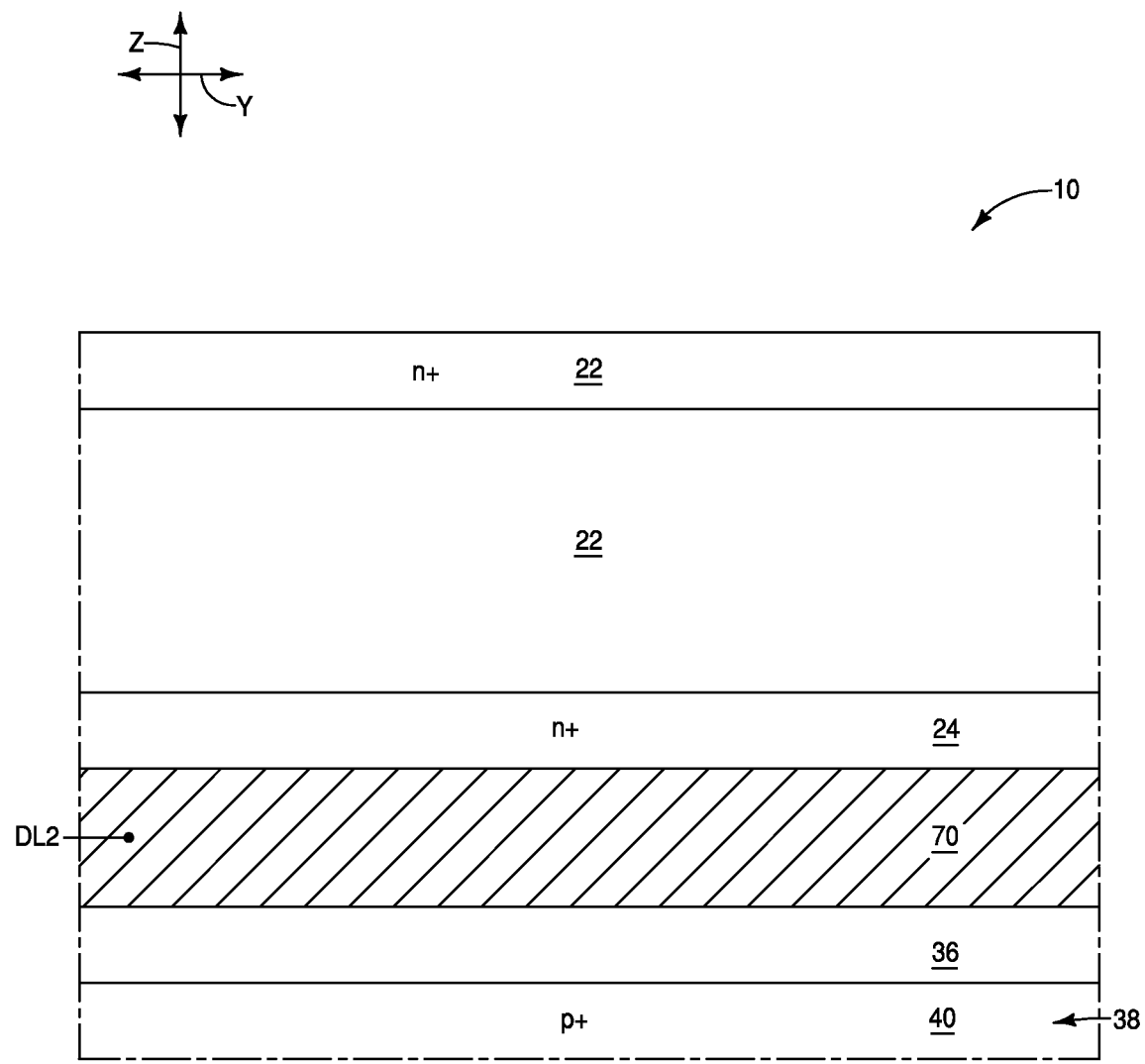

Referring to FIGS. 15-15B, the insulative panels 32 are formed within the slits 84 (FIGS. 14-14B). The insulative panels 32 comprise the insulative material 34.

The insulative panels 32 may comprise silicon dioxide. In some embodiments, the insulative material 36, the first insulative spacers 75 (FIG. 10A), the second insulative spacers 80 (FIG. 12A) and the insulative panels 32 may all comprise a same composition as one another (e.g., silicon dioxide). In some embodiments, at least one of the insulative material 36, the first insulative spacers 75 (FIG. 10A), the second insulative spacers 80 (FIG. 12A) and the insulative panels 32 is a different composition relative to another of the insulative material 36, the first insulative spacers 75 (FIG. 10A), the second insulative spacers 80 (FIG. 12A) and the insulative panels 32.

Figure 16:
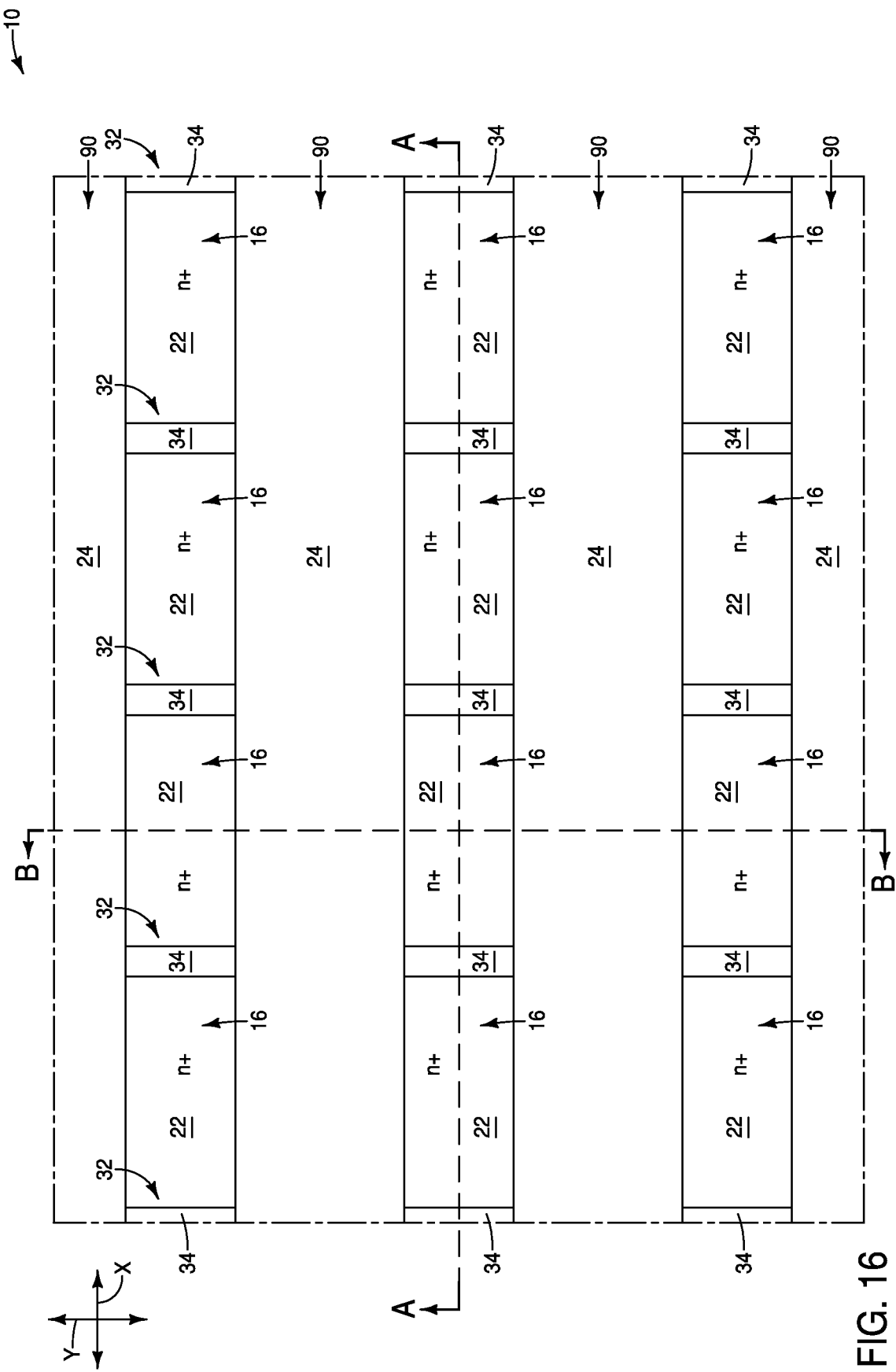
Figure 16A:
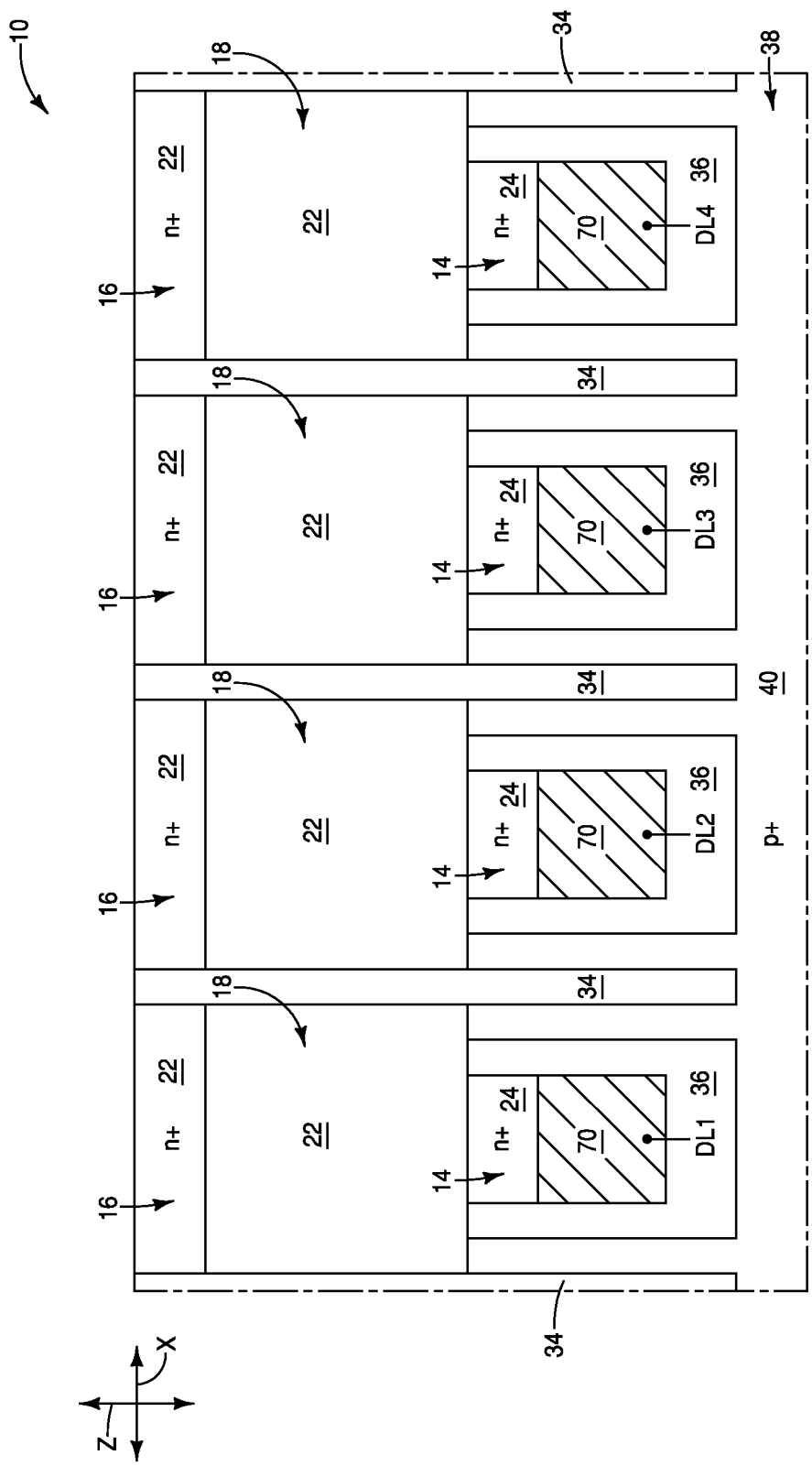
Figure 16B:
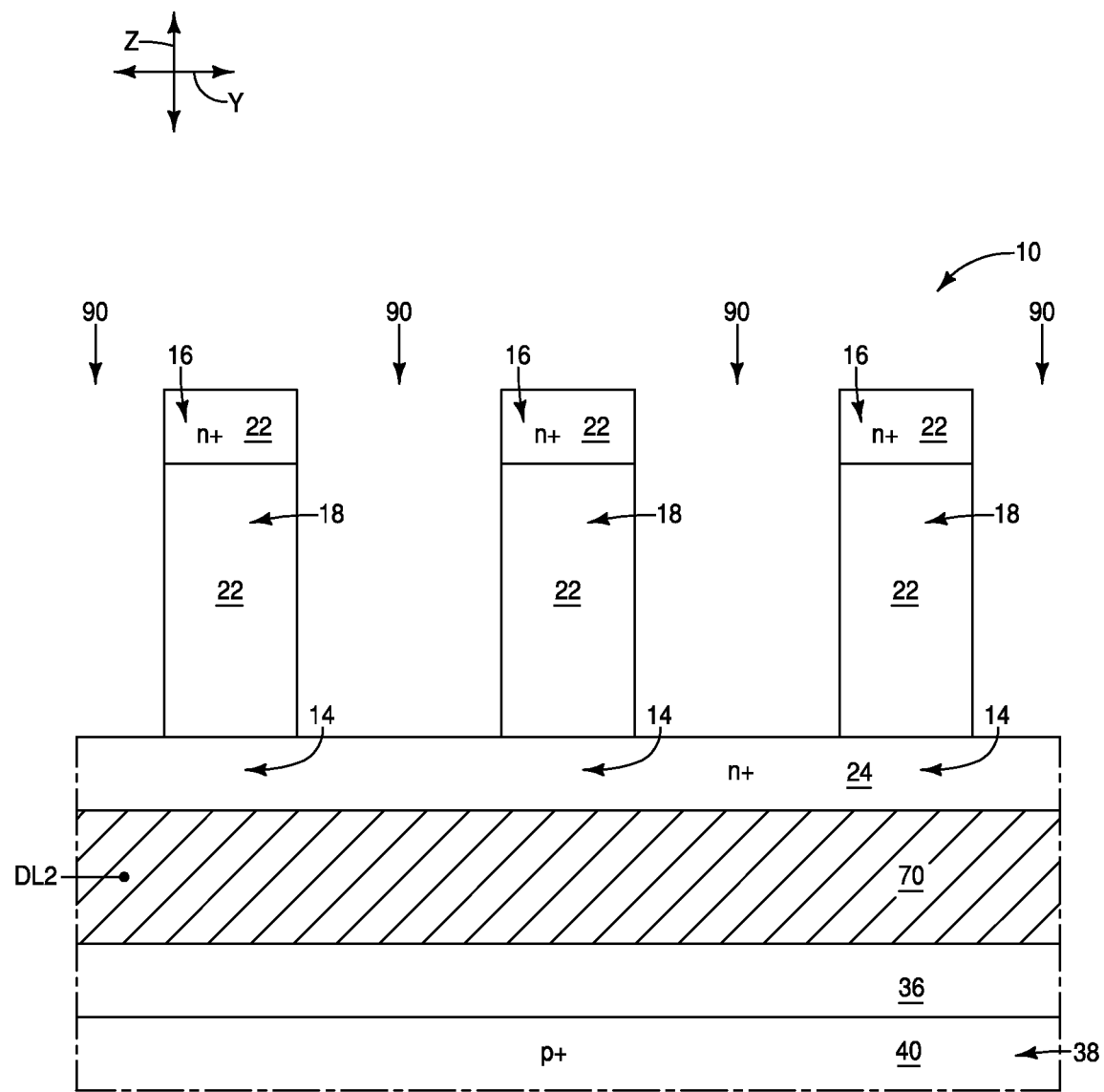

Referring to FIGS. 16-16B, trenches 90 are formed to extend through the third semiconductor material 22 and the insulative panels 32. The trenches 90 extend along the direction of the x-axis.

The trenches 90 may be formed with any suitable processing. For instance, a patterned mask (not shown) may be provided over construction 10 to define locations of the trenches 90; one or more etches may be utilized to form the trenches within the defined locations; and the mask may then be removed to leave the illustrated construction of FIGS. 16-16B.

The trenches 90 pattern the semiconductor material 22 into the transistor body regions 18 described above with reference to FIGS. 1-1B, and form (pattern) the upper source/drain regions 16.

Figure 17:
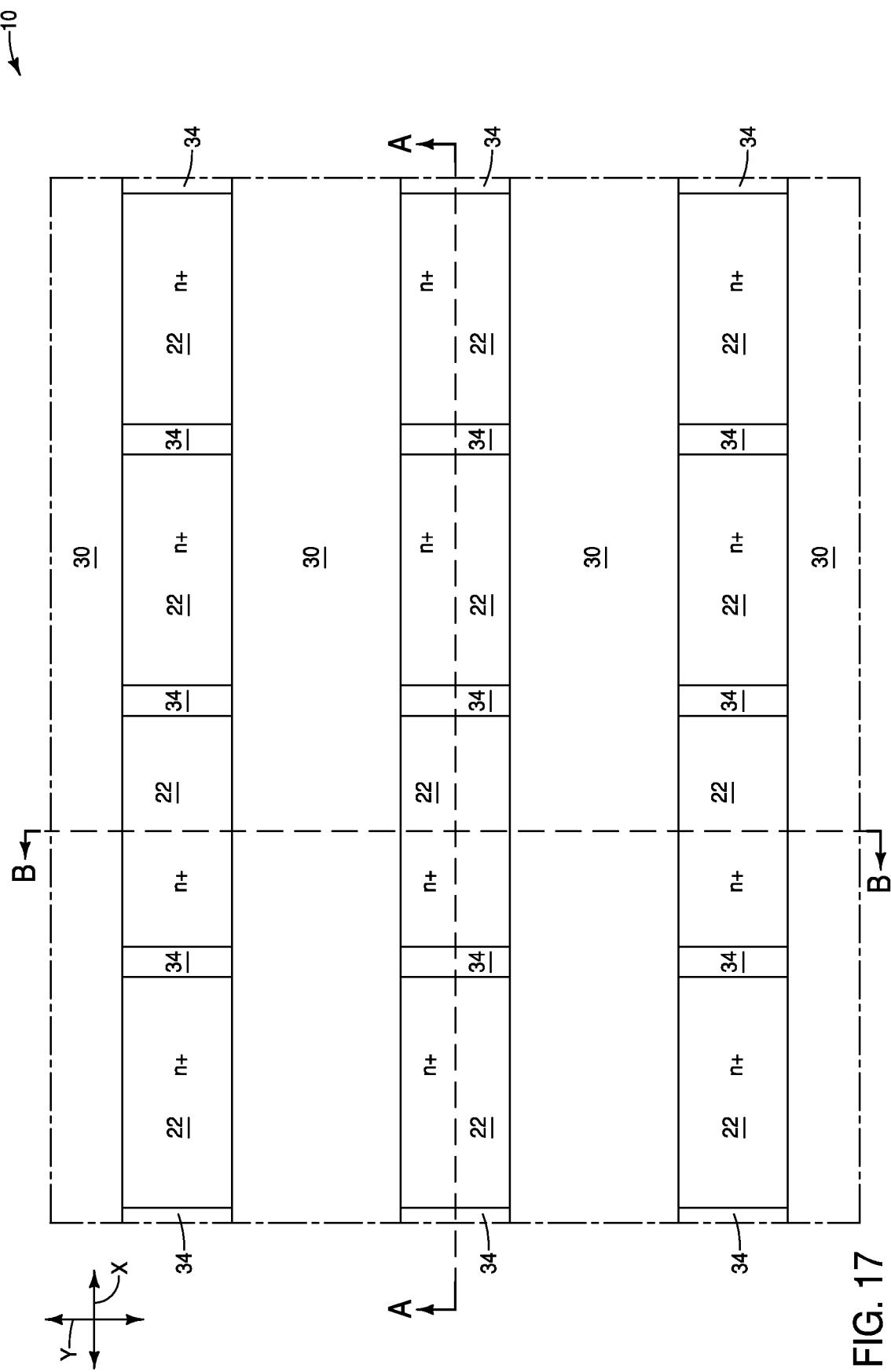
Figure 17A:
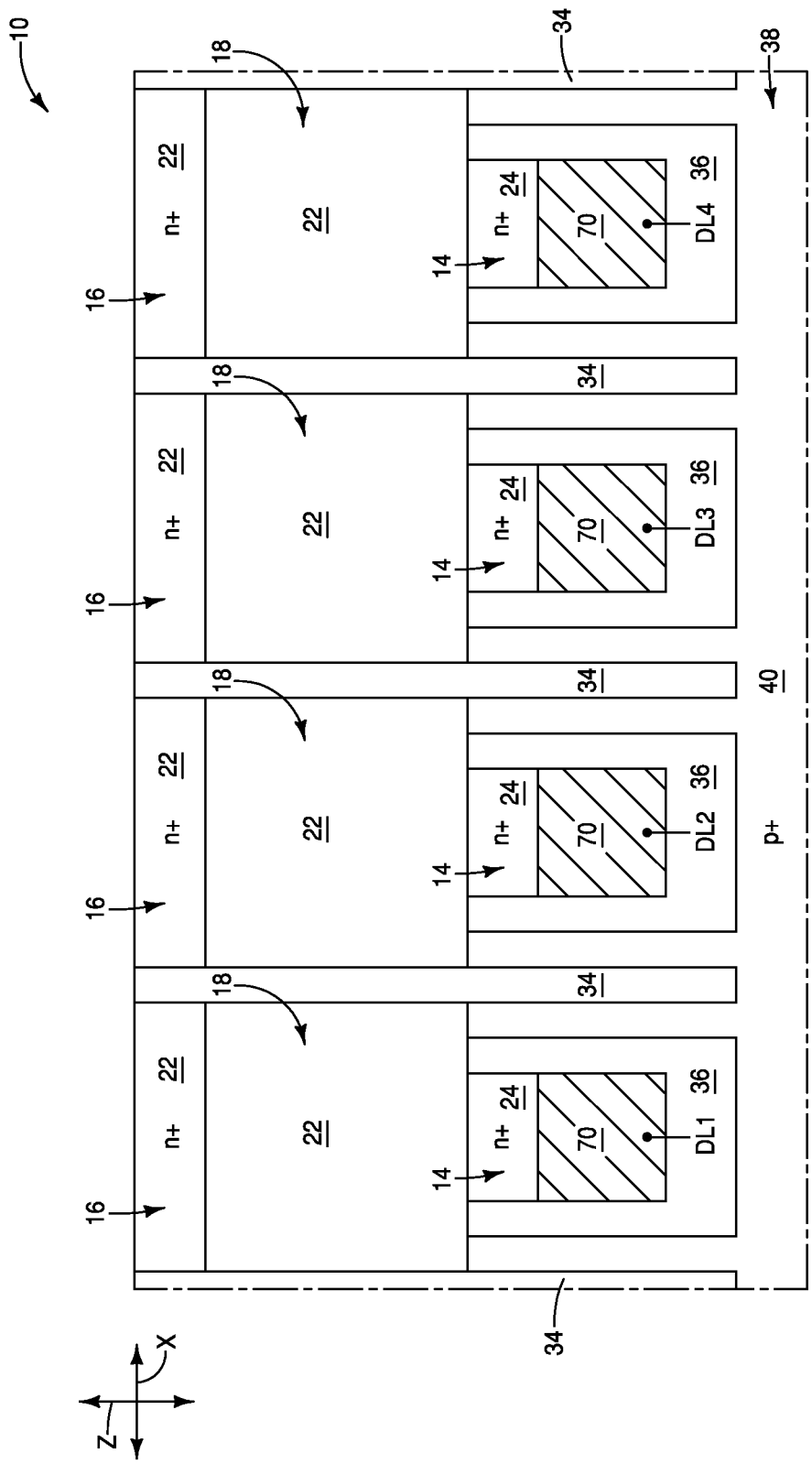
Figure 17B:
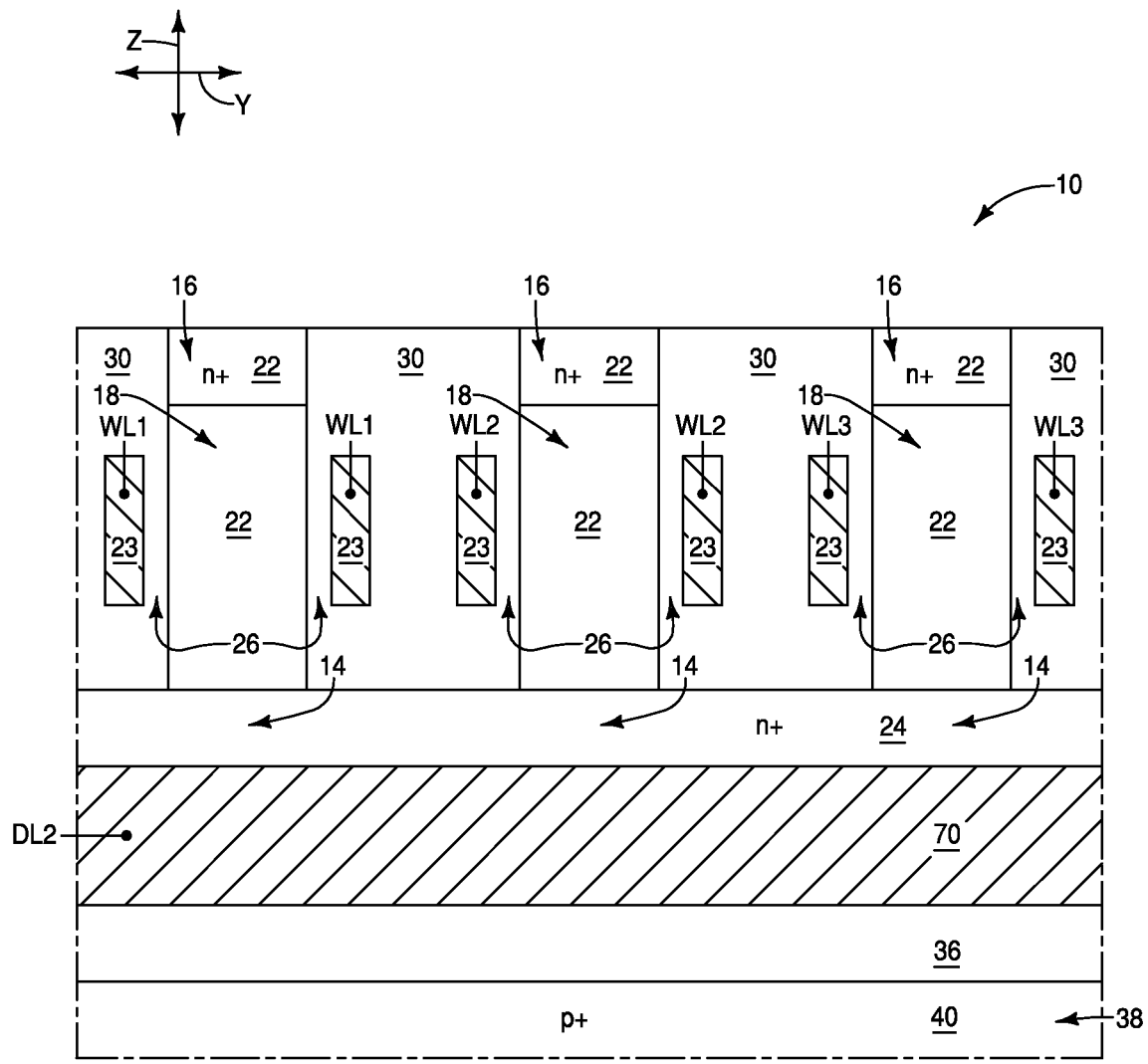

Referring to FIGS. 17-17B, gate dielectric material 26 and conductive wordline material 23 are formed and patterned within the trenches 90 (with such trenches being shown in FIGS. 16-16B) to form structures analogous to those described above with reference to FIGS. 1-1B. The materials may be formed and patterned within the trenches utilizing any suitable processing; either now known or yet to be developed. Persons of ordinary skill will readily recognize conventional methods which may be utilized to form the gate dielectric material 26 and conductive wordline material 23 into structures analogous to, or substantially identical to, the illustrated structures of FIGS. 17-17B.

The wordline material 23 forms the wordlines WL1, WL2 and WL3 described above with reference to FIGS. 1-1B.

The insulative material 30 is formed over and around the wordlines WL1, WL2 and WL3.

In subsequent processing the capacitors 15 (or other appropriate storage elements) may be formed over and in electrical connection with the source/drain regions 16 to form the memory array 50 described above with reference to FIGS. 1-1B.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a carrier-sink-structure, and having digit lines over the carrier-sink-structure. Transistor body regions are over the digit lines. Extensions extend from the carrier-sink-structure to the transistor body regions (or to at least a vertical level of the transistor body regions). The extensions are configured to drain excess carriers from the transistor body regions. Lower source/drain regions are between the transistor body regions and the digit lines, and are coupled with the digit lines. Upper source/drain regions are over the transistor body regions, and are coupled with storage elements. Wordlines are adjacent the transistor body regions. The transistor body regions, lower source/drain regions and upper source/drain regions are together comprised a plurality of transistors. The transistors and the storage elements are together comprised by a plurality of memory cells of a memory array.

Some embodiments include an integrated assembly having a lower carrier-sink-structure, first comparative digit lines over the lower carrier-sink-structure, and first source/drain regions over the first digit lines and coupled with the first digit lines. Vertically-extending first pillars are over the first source/drain regions. Each of the first pillars comprises a first transistor body region and a second source/drain region. Capacitors coupled with the second source/drain regions. Vertically-extending second pillars are over the capacitors. Each of the second pillars comprises a third source/drain region and a second transistor body region over the third source/drain region. The third source/drain regions are coupled with the second capacitor nodes. Fourth source/drain regions are over the second transistor body regions. Second comparative digit lines are over the fourth source/drain regions and are coupled with the fourth source/drain regions. Individuals of the first comparative digit lines are paired with individuals of the second comparative digit lines in a plurality of first/second comparative digit line sets. The comparative first and second digit lines of each of the first/second comparative digit line sets extend to a sense amplifier configured to compare electrical properties of the first and second comparative digit lines within the first/second comparative digit line set. An upper carrier-sink-structure is over the second digit lines. First extensions extend from the lower carrier-sink-structure to the first transistor body regions. The first extensions are configured to drain excess carriers from the first transistor body regions. Second extensions extend from the upper carrier-sink-structure to the second transistor body regions. The second extensions are configured to drain excess carriers from the second transistor body regions. Wordlines have components adjacent the first and second transistor body regions.

Some embodiments include a method of forming an integrated assembly. A stack is formed to comprise, in ascending order, a first semiconductor material, an insulative material, a digit line material, and a second semiconductor material. The first semiconductor material is either p-type doped or n-type doped, and the second semiconductor material is the other of p-type doped and n-type doped. The insulative material, the digit line material, and the second semiconductor material are patterned into rails extending along a first direction. The rails are spaced from one another by gaps. Regions of the first semiconductor material are exposed along bottom peripheries of the gaps. The rails have sidewalls along the gaps. The patterned digit line material within the rails is digit lines. First insulative spacers are formed along the sidewalls of the rails. Semiconductor extensions are formed along the first insulative spacers. The semiconductor extensions and the first insulative spacers narrow the gaps. Second insulative spacers are formed within the narrowed gaps. A planarized surface is formed to extend across the rails, the first insulative spacers, the semiconductor extensions and the second insulative spacers. Third semiconductor material is formed over and directly against the planarized surface. Slits are formed to extend through the third semiconductor material to the second insulative spacers. The slits extend linearly along the first direction. Insulative panels are formed within the slits. Trenches are formed to extend through the third semiconductor material and the insulative panels. The trenches extend along a second direction which crosses the first direction. The trenches pattern the third semiconductor material into pillars comprising transistor body regions. The second semiconductor material comprises first source/drain regions under the transistor body regions. Gate dielectric material is formed along sidewalls of the transistor body regions. Wordlines are formed along the gate dielectric material. The wordlines extend along the second direction. Second source/drain regions are formed within upper regions of the pillars. Storage elements are coupled with the second source/drain regions. The first source/drain regions, the second source/drain regions and the transistor body regions are together incorporated into access transistors. The access transistors and the storage elements are incorporated into memory cells of a memory array. The extensions are configured to drain excess carriers from the transistor body regions to the first semiconductor material during operation of the memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
a lower carrier-sink-structure;
first comparative digit lines over the lower carrier-sink-structure;
first source/drain regions over the first comparative digit lines and being coupled with the first comparative digit lines;
vertically-extending first pillars over the first source/drain regions; each of the first pillars comprising a first transistor body region and a second source/drain region;
capacitors coupled with the second source/drain regions;
vertically-extending second pillars over the capacitors; each of the second pillars comprising a third source/drain region and a second transistor body region over the third source/drain region; the third source/drain regions being coupled with capacitor nodes;
fourth source/drain regions over the second transistor body regions;
second comparative digit lines over the fourth source/drain regions and being coupled with the fourth source/drain regions; individuals of the first comparative digit lines being paired with individuals of the second comparative digit lines in a plurality of first/second comparative digit line sets; the first comparative digit lines and second comparative digit lines of each of the first/second comparative digit line sets extending to a sense amplifier configured to compare electrical properties of the first and second comparative digit lines within the first/second comparative digit line set;
an upper carrier-sink-structure over the second digit lines;
first extensions extending from the lower carrier-sink-structure to the first transistor body regions; the first extensions being configured to drain excess carriers from the first transistor body regions to the lower carrier-sink-structure;
second extensions extending from the upper carrier-sink-structure to the second transistor body regions; the second extensions being configured to drain excess carriers from the second transistor body regions to the upper carrier-sink-structure; and
gates having components adjacent the first and second transistor body regions.

2. The integrated assembly of claim 1 wherein the upper and lower carrier-sink-structures are coupled to a voltage source configured to provide a reference voltage to the upper and lower carrier-sink-structures.

3. The integrated assembly of claim 1 wherein the capacitors, first pillars and second pillars are together comprised by two-transistor-one-capacitor memory (2T-1C) memory cells of a memory array.

4. The integrated assembly of claim 3 wherein the memory array is within a tier; the tier being within a vertically-stacked arrangement of tiers and being over at least one other of the tiers within the vertically-stacked arrangement.

5. The integrated assembly of claim 1 wherein the upper and lower carrier-sink-structures are p-type.

6. The integrated assembly of claim 1 wherein the upper and lower carrier-sink-structures are n-type.

7. The integrated assembly of claim 1 wherein the first extensions directly contact the first transistor body regions; and wherein the second extensions directly contact the second transistor body regions.

8. The integrated assembly of claim 1 wherein the first extensions are spaced from the first transistor body regions by first intervening insulative regions; and wherein the second extensions are spaced from the second transistor body regions by second intervening insulative regions.

* * * * *